United States Patent [19]

Ishizawa

[11] Patent Number: 5,757,296
[45] Date of Patent: May 26, 1998

[54] DATA DECODING APPARATUS AND METHOD AND RECORDING MEDIUM

[75] Inventor: Yoshiyuki Ishizawa, Yokohama, Japan

[73] Assignee: Kabushiki Kaisha Toshiba, Kawasaki, Japan

[21] Appl. No.: 630,616

[22] Filed: Apr. 10, 1996

[30] Foreign Application Priority Data

Apr. 12, 1995 [JP] Japan ..................... 7-086878

[51] Int. Cl.⁶ .................................... H03M 7/00
[52] U.S. Cl. .................................... 341/95; 341/59
[58] Field of Search ................... 341/58, 59, 95, 341/106

[56] References Cited

U.S. PATENT DOCUMENTS

| | | | |
|---|---|---|---|
| 4,833,470 | 5/1989 | Iketani | 341/59 |
| 5,155,485 | 10/1992 | Sako et al. | 341/95 |
| 5,196,848 | 3/1993 | Sakazaki | 341/58 |
| 5,304,997 | 4/1994 | Konno | 341/95 |
| 5,486,828 | 1/1996 | Mikami | 341/59 |
| 5,491,479 | 2/1996 | Wilkinson | 341/58 |

FOREIGN PATENT DOCUMENTS 6-020399 1/1994 Japan .
6-014617 2/1994 Japan .

OTHER PUBLICATIONS

Tang, et al: "Block Codes for a Class of Constrained Noiseless Channels", Information and Control 17, 436–461 (1970) pp. 436 and 451.
Schouhamer Immink K A et al., "Optimization of low–frequency properties of eight–to–fourteen modulation", Radio and Electronic Engineer, Feb. 1983, vol. 53, No. 2, pp.63–66.

*Primary Examiner*—Marc S. Hoff
*Attorney, Agent, or Firm*—Cushman Darby & Cushman IP Group of Pillsbury Madison & Sutro LLP

[57] ABSTRACT

Even if an element such as a ROM is not used, a code reverse conversion can be realized by a sufficiently small scale circuit to be effective for integration. When code data group converted from 8-bit to 15-bit according to a predetermined rule is converted to original 8-bit code data group, an exclusive logic processor 11, a bit shift processor 12, a six-to-four decoder and an eleven-to-eight decoder 14 divides the 15(m) bit code (dividing by m at the maximum) into a plurality of areas, converts "1" (in the case of positive logic) in response to the generated bit position in the respective areas, and the numeric codes obtained by the numeric value converting means are added by an adder 15.

16 Claims, 21 Drawing Sheets

TABLE A (175 CODES)

| | | | | | | | | | | | | | | | |
|---|---|---|---|---|---|---|---|---|---|---|---|---|---|---|---|
| 0 | 0 | 0 | 0 | 1 | 0 | 0 | 0 | 0 | 0 | 0 | 0 | 0 | 0 | 0 | 0 |
| 1 | 1 | 0 | 0 | 1 | 0 | 0 | 0 | 0 | 0 | 0 | 0 | 0 | 0 | 0 | 0 |
| 2 | 0 | 0 | 0 | 0 | 1 | 0 | 0 | 0 | 0 | 0 | 0 | 0 | 0 | 0 | 0 |
| 3 | 1 | 0 | 0 | 0 | 1 | 0 | 0 | 0 | 0 | 0 | 0 | 0 | 0 | 0 | 0 |
| 4 | 0 | 1 | 0 | 0 | 1 | 0 | 0 | 0 | 0 | 0 | 0 | 0 | 0 | 0 | 0 |
| 5 | 1 | 0 | 0 | 0 | 0 | 1 | 0 | 0 | 0 | 0 | 0 | 0 | 0 | 0 | 0 |
| 6 | 0 | 1 | 0 | 0 | 0 | 1 | 0 | 0 | 0 | 0 | 0 | 0 | 0 | 0 | 0 |
| 7 | 0 | 0 | 1 | 0 | 0 | 1 | 0 | 0 | 0 | 0 | 0 | 0 | 0 | 0 | 0 |
| 8 | 0 | 0 | 0 | 0 | 0 | 1 | 0 | 0 | 0 | 0 | 0 | 0 | 0 | 0 | 0 |
| 9 | 1 | 0 | 0 | 0 | 0 | 1 | 0 | 0 | 0 | 0 | 0 | 0 | 0 | 0 | 0 |
| 10 | 0 | 1 | 0 | 0 | 0 | 0 | 1 | 0 | 0 | 0 | 0 | 0 | 0 | 0 | 0 |
| 11 | 0 | 0 | 1 | 0 | 0 | 0 | 1 | 0 | 0 | 0 | 0 | 0 | 0 | 0 | 0 |
| 12 | 0 | 0 | 0 | 1 | 0 | 0 | 1 | 0 | 0 | 0 | 0 | 0 | 0 | 0 | 0 |
| 13 | 1 | 0 | 0 | 1 | 0 | 0 | 1 | 0 | 0 | 0 | 0 | 0 | 0 | 0 | 0 |
| 14 | 1 | 0 | 0 | 0 | 0 | 0 | 1 | 0 | 0 | 0 | 0 | 0 | 0 | 0 | 0 |
| 15 | 0 | 1 | 0 | 0 | 0 | 0 | 1 | 0 | 0 | 0 | 0 | 0 | 0 | 0 | 0 |
| 16 | 0 | 0 | 1 | 0 | 0 | 0 | 1 | 0 | 0 | 0 | 0 | 0 | 0 | 0 | 0 |
| 17 | 0 | 0 | 0 | 1 | 0 | 0 | 1 | 0 | 0 | 0 | 0 | 0 | 0 | 0 | 0 |
| 18 | 1 | 0 | 0 | 1 | 0 | 0 | 1 | 0 | 0 | 0 | 0 | 0 | 0 | 0 | 0 |
| 19 | 0 | 0 | 0 | 0 | 1 | 0 | 0 | 1 | 0 | 0 | 0 | 0 | 0 | 0 | 0 |
| 20 | 1 | 0 | 0 | 0 | 1 | 0 | 0 | 1 | 0 | 0 | 0 | 0 | 0 | 0 | 0 |
| 21 | 0 | 1 | 0 | 0 | 1 | 0 | 0 | 1 | 0 | 0 | 0 | 0 | 0 | 0 | 0 |
| 22 | 1 | 0 | 0 | 0 | 0 | 0 | 0 | 1 | 0 | 0 | 0 | 0 | 0 | 0 | 0 |
| 23 | 0 | 1 | 0 | 0 | 0 | 0 | 0 | 1 | 0 | 0 | 0 | 0 | 0 | 0 | 0 |
| 24 | 0 | 0 | 1 | 0 | 0 | 0 | 0 | 1 | 0 | 0 | 0 | 0 | 0 | 0 | 0 |
| 25 | 0 | 0 | 0 | 1 | 0 | 0 | 0 | 1 | 0 | 0 | 0 | 0 | 0 | 0 | 0 |
| 26 | 1 | 0 | 0 | 1 | 0 | 0 | 0 | 1 | 0 | 0 | 0 | 0 | 0 | 0 | 0 |
| 27 | 0 | 0 | 0 | 0 | 1 | 0 | 0 | 1 | 0 | 0 | 0 | 0 | 0 | 0 | 0 |
| 28 | 1 | 0 | 0 | 0 | 1 | 0 | 0 | 1 | 0 | 0 | 0 | 0 | 0 | 0 | 0 |
| 29 | 0 | 1 | 0 | 0 | 1 | 0 | 0 | 1 | 0 | 0 | 0 | 0 | 0 | 0 | 0 |
| 30 | 0 | 0 | 0 | 0 | 0 | 1 | 0 | 1 | 0 | 0 | 0 | 0 | 0 | 0 | 0 |
| 31 | 1 | 0 | 0 | 0 | 0 | 1 | 0 | 1 | 0 | 0 | 0 | 0 | 0 | 0 | 0 |
| 32 | 0 | 1 | 0 | 0 | 0 | 1 | 0 | 1 | 0 | 0 | 0 | 0 | 0 | 0 | 0 |
| 33 | 0 | 0 | 1 | 0 | 0 | 1 | 0 | 1 | 0 | 0 | 0 | 0 | 0 | 0 | 0 |
| 34 | 1 | 0 | 0 | 0 | 0 | 0 | 0 | 0 | 1 | 0 | 0 | 0 | 0 | 0 | 0 |
| 35 | 0 | 1 | 0 | 0 | 0 | 0 | 0 | 0 | 1 | 0 | 0 | 0 | 0 | 0 | 0 |
| 36 | 0 | 0 | 1 | 0 | 0 | 0 | 0 | 0 | 1 | 0 | 0 | 0 | 0 | 0 | 0 |
| 37 | 0 | 0 | 0 | 1 | 0 | 0 | 0 | 0 | 1 | 0 | 0 | 0 | 0 | 0 | 0 |
| 38 | 1 | 0 | 0 | 1 | 0 | 0 | 0 | 0 | 1 | 0 | 0 | 0 | 0 | 0 | 0 |
| 39 | 0 | 0 | 0 | 0 | 1 | 0 | 0 | 0 | 1 | 0 | 0 | 0 | 0 | 0 | 0 |
| 40 | 1 | 0 | 0 | 0 | 1 | 0 | 0 | 0 | 1 | 0 | 0 | 0 | 0 | 0 | 0 |

FIG. 1A

| | | | | | | | | | | | | | | | |
|---|---|---|---|---|---|---|---|---|---|---|---|---|---|---|---|
|4 1|0|1|0|0|1|0|0|0|1|0|0|0|0|0|
|4 2|0|0|0|0|0|1|0|0|1|0|0|0|0|0|
|4 3|1|0|0|0|0|1|0|0|1|0|0|0|0|0|
|4 4|0|1|0|0|0|1|0|0|1|0|0|0|0|0|
|4 5|0|0|1|0|0|1|0|0|1|0|0|0|0|0|
|4 6|0|0|0|0|0|0|1|0|0|1|0|0|0|0|
|4 7|1|0|0|0|0|0|1|0|0|1|0|0|0|0|
|4 8|0|1|0|0|0|0|1|0|0|1|0|0|0|0|
|4 9|0|0|1|0|0|0|1|0|0|1|0|0|0|0|
|5 0|0|0|0|1|0|0|1|0|0|1|0|0|0|0|
|5 1|1|0|0|1|0|0|1|0|0|1|0|0|0|0|
|5 2|1|0|0|0|0|0|0|0|0|1|0|0|0|0|
|5 3|0|1|0|0|0|0|0|0|0|1|0|0|0|0|
|5 4|0|0|1|0|0|0|0|0|0|1|0|0|0|0|
|5 5|0|0|0|1|0|0|0|0|0|1|0|0|0|0|
|5 6|1|0|0|1|0|0|0|0|0|1|0|0|0|0|
|5 7|0|0|0|0|1|0|0|0|0|1|0|0|0|0|
|5 8|1|0|0|0|1|0|0|0|0|1|0|0|0|0|
|5 9|0|1|0|0|1|0|0|0|0|1|0|0|0|0|
|6 0|0|0|0|0|1|0|0|0|0|1|0|0|0|0|
|6 1|1|0|0|0|0|1|0|0|0|1|0|0|0|0|
|6 2|0|1|0|0|0|1|0|0|0|1|0|0|0|0|
|6 3|0|0|1|0|0|1|0|0|0|1|0|0|0|0|
|6 4|0|0|0|0|0|1|0|0|0|1|0|0|0|0|
|6 5|1|0|0|0|0|1|0|0|0|1|0|0|0|0|
|6 6|0|1|0|0|0|0|1|0|0|1|0|0|0|0|
|6 7|0|0|1|0|0|1|0|0|0|1|0|0|0|0|
|6 8|0|0|0|1|0|0|1|0|0|1|0|0|0|0|
|6 9|1|0|0|1|0|0|1|0|0|1|0|0|0|0|
|7 0|0|0|0|0|0|0|1|0|0|1|0|0|0|0|
|7 1|1|0|0|0|0|0|1|0|0|1|0|0|0|0|
|7 2|0|1|0|0|0|0|1|0|0|1|0|0|0|0|
|7 3|0|0|1|0|0|0|1|0|0|1|0|0|0|0|
|7 4|0|0|0|1|0|0|1|0|0|1|0|0|0|0|
|7 5|1|0|0|1|0|0|1|0|0|1|0|0|0|0|
|7 6|0|0|0|0|1|0|0|1|0|1|0|0|0|0|
|7 7|1|0|0|0|1|0|0|1|0|1|0|0|0|0|
|7 8|0|1|0|0|1|0|0|1|0|1|0|0|0|0|
|7 9|1|0|0|0|0|0|0|0|0|0|1|0|0|0|
|8 0|0|1|0|0|0|0|0|0|0|0|1|0|0|0|
|8 1|0|0|1|0|0|0|0|0|0|0|1|0|0|0|
|8 2|0|0|0|1|0|0|0|0|0|0|1|0|0|0|
|8 3|1|0|0|1|0|0|0|0|0|0|1|0|0|0|

F I G. 1 B

| | | | | | | | | | | | | | | | | |
|---|---|---|---|---|---|---|---|---|---|---|---|---|---|---|---|---|
| 8 4 | 0 | 0 | 0 | 0 | 1 | 0 | 0 | 0 | 0 | 0 | 1 | 0 | 0 | 0 |
| 8 5 | 1 | 0 | 0 | 0 | 1 | 0 | 0 | 0 | 0 | 0 | 1 | 0 | 0 | 0 |
| 8 6 | 0 | 1 | 0 | 0 | 1 | 0 | 0 | 0 | 0 | 0 | 1 | 0 | 0 | 0 |
| 8 7 | 0 | 0 | 0 | 0 | 0 | 1 | 0 | 0 | 0 | 0 | 1 | 0 | 0 | 0 |
| 8 8 | 1 | 0 | 0 | 0 | 0 | 1 | 0 | 0 | 0 | 0 | 1 | 0 | 0 | 0 |
| 8 9 | 0 | 1 | 0 | 0 | 0 | 1 | 0 | 0 | 0 | 0 | 1 | 0 | 0 | 0 |
| 9 0 | 0 | 0 | 1 | 0 | 0 | 1 | 0 | 0 | 0 | 0 | 1 | 0 | 0 | 0 |
| 9 1 | 0 | 0 | 0 | 0 | 0 | 1 | 0 | 0 | 0 | 0 | 1 | 0 | 0 | 0 |
| 9 2 | 1 | 0 | 0 | 0 | 0 | 1 | 0 | 0 | 0 | 0 | 1 | 0 | 0 | 0 |
| 9 3 | 0 | 1 | 0 | 0 | 0 | 0 | 1 | 0 | 0 | 0 | 1 | 0 | 0 | 0 |
| 9 4 | 0 | 0 | 1 | 0 | 0 | 1 | 0 | 0 | 0 | 0 | 1 | 0 | 0 | 0 |
| 9 5 | 0 | 0 | 0 | 1 | 0 | 1 | 0 | 0 | 0 | 0 | 1 | 0 | 0 | 0 |
| 9 6 | 1 | 0 | 1 | 0 | 0 | 1 | 0 | 0 | 0 | 0 | 1 | 0 | 0 | 0 |
| 9 7 | 0 | 0 | 0 | 0 | 0 | 0 | 1 | 0 | 0 | 0 | 1 | 0 | 0 | 0 |
| 9 8 | 1 | 0 | 0 | 0 | 0 | 0 | 1 | 0 | 0 | 0 | 1 | 0 | 0 | 0 |
| 9 9 | 0 | 1 | 0 | 0 | 0 | 0 | 1 | 0 | 0 | 0 | 1 | 0 | 0 | 0 |
| 1 0 0 | 0 | 0 | 1 | 0 | 0 | 0 | 1 | 0 | 0 | 0 | 1 | 0 | 0 | 0 |
| 1 0 1 | 0 | 0 | 0 | 1 | 0 | 0 | 1 | 0 | 0 | 0 | 1 | 0 | 0 | 0 |
| 1 0 2 | 1 | 0 | 0 | 1 | 0 | 0 | 1 | 0 | 0 | 0 | 1 | 0 | 0 | 0 |
| 1 0 3 | 0 | 0 | 0 | 0 | 1 | 0 | 1 | 0 | 0 | 0 | 1 | 0 | 0 | 0 |
| 1 0 4 | 1 | 0 | 0 | 1 | 0 | 0 | 1 | 0 | 0 | 0 | 1 | 0 | 0 | 0 |
| 1 0 5 | 0 | 1 | 0 | 0 | 1 | 0 | 1 | 0 | 0 | 0 | 1 | 0 | 0 | 0 |
| 1 0 6 | 1 | 0 | 0 | 0 | 0 | 0 | 0 | 1 | 0 | 0 | 1 | 0 | 0 | 0 |
| 1 0 7 | 0 | 1 | 0 | 0 | 0 | 0 | 0 | 1 | 0 | 0 | 1 | 0 | 0 | 0 |
| 1 0 8 | 0 | 0 | 1 | 0 | 0 | 0 | 0 | 1 | 0 | 0 | 1 | 0 | 0 | 0 |
| 1 0 9 | 0 | 0 | 0 | 1 | 0 | 0 | 0 | 1 | 0 | 0 | 1 | 0 | 0 | 0 |
| 1 1 0 | 1 | 0 | 0 | 1 | 0 | 0 | 0 | 1 | 0 | 0 | 1 | 0 | 0 | 0 |
| 1 1 1 | 0 | 0 | 0 | 0 | 1 | 0 | 0 | 1 | 0 | 0 | 1 | 0 | 0 | 0 |
| 1 1 2 | 1 | 0 | 0 | 1 | 0 | 0 | 0 | 1 | 0 | 0 | 1 | 0 | 0 | 0 |
| 1 1 3 | 0 | 1 | 0 | 0 | 1 | 0 | 0 | 1 | 0 | 0 | 1 | 0 | 0 | 0 |
| 1 1 4 | 0 | 0 | 0 | 0 | 0 | 1 | 0 | 0 | 1 | 0 | 1 | 0 | 0 | 0 |
| 1 1 5 | 1 | 0 | 0 | 0 | 1 | 0 | 0 | 1 | 0 | 0 | 1 | 0 | 0 | 0 |
| 1 1 6 | 0 | 1 | 0 | 0 | 0 | 1 | 0 | 0 | 1 | 0 | 1 | 0 | 0 | 0 |
| 1 1 7 | 0 | 0 | 1 | 0 | 0 | 1 | 0 | 0 | 1 | 0 | 1 | 0 | 0 | 0 |
| 1 1 8 | 1 | 0 | 0 | 0 | 0 | 0 | 0 | 0 | 0 | 0 | 0 | 1 | 0 | 0 |
| 1 1 9 | 0 | 1 | 0 | 0 | 0 | 0 | 0 | 0 | 0 | 0 | 0 | 1 | 0 | 0 |
| 1 2 0 | 0 | 0 | 1 | 0 | 0 | 0 | 0 | 0 | 0 | 0 | 0 | 1 | 0 | 0 |
| 1 2 1 | 0 | 0 | 0 | 1 | 0 | 0 | 0 | 0 | 0 | 0 | 0 | 1 | 0 | 0 |
| 1 2 2 | 1 | 0 | 0 | 1 | 0 | 0 | 0 | 0 | 0 | 0 | 0 | 1 | 0 | 0 |
| 1 2 3 | 0 | 0 | 0 | 0 | 1 | 0 | 0 | 0 | 0 | 0 | 0 | 1 | 0 | 0 |
| 1 2 4 | 1 | 0 | 0 | 0 | 1 | 0 | 0 | 0 | 0 | 0 | 0 | 1 | 0 | 0 |
| 1 2 5 | 0 | 1 | 0 | 0 | 1 | 0 | 0 | 0 | 0 | 0 | 0 | 1 | 0 | 0 |
| 1 2 6 | 0 | 0 | 0 | 0 | 0 | 1 | 0 | 0 | 0 | 0 | 0 | 1 | 0 | 0 |

TABLE B ( 81 CODES)

| | | | | | | | | | | | | | | |
|---|---|---|---|---|---|---|---|---|---|---|---|---|---|---|
|175|0|1|0|0|0|0|0|0|0|0|0|0|1|0|
|176|0|0|1|0|0|0|0|0|0|0|0|0|1|0|
|177|0|0|0|1|0|0|0|0|0|0|0|0|1|0|
|178|1|0|0|1|0|0|0|0|0|0|0|0|1|0|
|179|0|0|0|0|1|0|0|0|0|0|0|0|1|0|
|180|1|0|0|0|1|0|0|0|0|0|0|0|1|0|
|181|0|1|0|0|1|0|0|0|0|0|0|0|1|0|
|182|0|0|0|0|0|1|0|0|0|0|0|0|1|0|
|183|1|0|0|0|0|1|0|0|0|0|0|0|1|0|
|184|0|1|0|0|0|1|0|0|0|0|0|0|1|0|
|185|0|0|1|0|0|1|0|0|0|0|0|0|1|0|
|186|0|0|0|0|0|0|1|0|0|0|0|0|1|0|
|187|1|0|0|0|0|0|1|0|0|0|0|0|1|0|
|188|0|1|0|0|0|0|1|0|0|0|0|0|1|0|
|189|0|0|1|0|0|0|1|0|0|0|0|0|1|0|
|190|0|0|0|1|0|0|1|0|0|0|0|0|1|0|
|191|1|0|0|1|0|0|1|0|0|0|0|0|1|0|
|192|1|0|0|0|0|0|0|1|0|0|0|0|1|0|
|193|0|1|0|0|0|0|0|1|0|0|0|0|1|0|
|194|0|0|1|0|0|0|0|1|0|0|0|0|1|0|
|195|0|0|0|1|0|0|0|1|0|0|0|0|1|0|
|196|1|0|0|1|0|0|0|1|0|0|0|0|1|0|
|197|0|0|0|0|1|0|0|1|0|0|0|0|1|0|
|198|1|0|0|0|1|0|0|1|0|0|0|0|1|0|
|199|0|1|0|0|1|0|0|1|0|0|0|0|1|0|
|200|1|0|0|0|0|0|0|1|0|0|0|0|1|0|
|201|0|1|0|0|0|0|0|1|0|0|0|0|1|0|
|202|0|0|1|0|0|0|0|1|0|0|0|0|1|0|
|203|0|0|0|1|0|0|0|1|0|0|0|0|1|0|
|204|1|0|0|1|0|0|0|1|0|0|0|0|1|0|
|205|0|0|0|0|1|0|0|1|0|0|0|0|1|0|
|206|1|0|0|0|1|0|0|1|0|0|0|0|1|0|
|207|0|1|0|0|1|0|0|1|0|0|0|0|1|0|
|208|0|0|0|0|0|1|0|1|0|0|0|0|1|0|
|209|1|0|0|0|0|1|0|1|0|0|0|0|1|0|
|210|0|1|0|0|0|1|0|1|0|0|0|0|1|0|
|211|0|0|1|0|0|1|0|1|0|0|0|0|1|0|
|212|1|0|0|0|0|0|0|0|1|0|0|0|1|0|
|213|0|1|0|0|0|0|0|0|1|0|0|0|1|0|
|214|0|0|1|0|0|0|0|0|1|0|0|0|1|0|
|215|0|0|0|1|0|0|0|0|1|0|0|0|1|0|

F I G. 2A

| | |
|---|---|
| 2 1 6 | 1 0 0 1 0 0 0 0 1 0 0 0 1 0 |
| 2 1 7 | 0 0 0 0 1 0 0 0 1 0 0 0 1 0 |
| 2 1 8 | 1 0 0 0 1 0 0 0 1 0 0 0 1 0 |
| 2 1 9 | 0 1 0 0 1 0 0 0 1 0 0 0 1 0 |
| 2 2 0 | 0 0 0 0 0 1 0 0 1 0 0 0 1 0 |
| 2 2 1 | 1 0 0 0 0 1 0 0 1 0 0 0 1 0 |
| 2 2 2 | 0 1 0 0 0 1 0 0 1 0 0 0 1 0 |
| 2 2 3 | 0 0 1 0 0 1 0 0 1 0 0 0 1 0 |
| 2 2 4 | 0 0 0 0 0 0 1 0 1 0 0 0 1 0 |
| 2 2 5 | 1 0 0 0 0 0 1 0 1 0 0 0 1 0 |
| 2 2 6 | 0 1 0 0 0 0 1 0 1 0 0 0 1 0 |
| 2 2 7 | 0 0 1 0 0 0 1 0 1 0 0 0 1 0 |
| 2 2 8 | 0 0 0 1 0 0 1 0 1 0 0 0 1 0 |
| 2 2 9 | 1 0 0 1 0 0 1 0 1 0 0 0 1 0 |
| 2 3 0 | 1 0 0 0 0 0 0 0 0 1 0 0 1 0 |
| 2 3 1 | 0 1 0 0 0 0 0 0 0 1 0 0 1 0 |
| 2 3 2 | 0 0 1 0 0 0 0 0 0 1 0 0 1 0 |
| 2 3 3 | 0 0 0 1 0 0 0 0 0 1 0 0 1 0 |
| 2 3 4 | 1 0 0 1 0 0 0 0 0 1 0 0 1 0 |
| 2 3 5 | 0 0 0 0 1 0 0 0 0 1 0 0 1 0 |
| 2 3 6 | 1 0 0 0 1 0 0 0 0 1 0 0 1 0 |
| 2 3 7 | 0 1 0 0 1 0 0 0 0 1 0 0 1 0 |
| 2 3 8 | 0 0 0 0 0 1 0 0 0 1 0 0 1 0 |
| 2 3 9 | 1 0 0 0 0 1 0 0 0 1 0 0 1 0 |
| 2 4 0 | 0 1 0 0 0 1 0 0 0 1 0 0 1 0 |
| 2 4 1 | 0 0 1 0 0 1 0 0 0 1 0 0 1 0 |
| 2 4 2 | 0 0 0 0 0 0 1 0 0 1 0 0 1 0 |
| 2 4 3 | 1 0 0 0 0 0 1 0 0 1 0 0 1 0 |
| 2 4 4 | 0 1 0 0 0 0 1 0 0 1 0 0 1 0 |
| 2 4 5 | 0 0 1 0 0 0 1 0 0 1 0 0 1 0 |
| 2 4 6 | 0 0 0 1 0 0 1 0 0 1 0 0 1 0 |
| 2 4 7 | 1 0 0 1 0 0 1 0 0 1 0 0 1 0 |
| 2 4 8 | 1 0 0 0 0 0 0 1 0 1 0 0 1 0 |
| 2 4 9 | 0 1 0 0 0 0 0 1 0 1 0 0 1 0 |
| 2 5 0 | 0 0 1 0 0 0 0 1 0 1 0 0 1 0 |
| 2 5 1 | 0 0 0 1 0 0 0 1 0 1 0 0 1 0 |
| 2 5 2 | 1 0 0 1 0 0 0 1 0 1 0 0 1 0 |
| 2 5 3 | 0 0 0 0 1 0 0 1 0 1 0 0 1 0 |
| 2 5 4 | 1 0 0 0 1 0 0 1 0 1 0 0 1 0 |
| 2 5 5 | 0 1 0 0 1 0 0 1 0 1 0 0 1 0 |

F I G. 2B

TABLE C ( 81 CODES)

| | | | | | | | | | | | | | | |
|---|---|---|---|---|---|---|---|---|---|---|---|---|---|---|
| 175 | 0 | 1 | 0 | 0 | 1 | 0 | 0 | 0 | 0 | 0 | 0 | 0 | 0 | 1 |
| 176 | 0 | 0 | 1 | 0 | 0 | 1 | 0 | 0 | 0 | 0 | 0 | 0 | 0 | 1 |
| 177 | 0 | 0 | 0 | 1 | 0 | 0 | 1 | 0 | 0 | 0 | 0 | 0 | 0 | 1 |
| 178 | 1 | 0 | 0 | 1 | 0 | 0 | 0 | 0 | 0 | 0 | 0 | 0 | 0 | 1 |
| 179 | 0 | 0 | 0 | 0 | 1 | 0 | 0 | 1 | 0 | 0 | 0 | 0 | 0 | 1 |
| 180 | 1 | 0 | 0 | 0 | 1 | 0 | 0 | 1 | 0 | 0 | 0 | 0 | 0 | 1 |
| 181 | 0 | 1 | 0 | 0 | 0 | 0 | 0 | 0 | 0 | 0 | 0 | 0 | 0 | 1 |
| 182 | 0 | 0 | 0 | 0 | 0 | 1 | 0 | 0 | 1 | 0 | 0 | 0 | 0 | 1 |
| 183 | 1 | 0 | 0 | 0 | 0 | 1 | 0 | 0 | 1 | 0 | 0 | 0 | 0 | 1 |
| 184 | 0 | 1 | 0 | 0 | 0 | 1 | 0 | 0 | 1 | 0 | 0 | 0 | 0 | 1 |
| 185 | 0 | 0 | 1 | 0 | 0 | 0 | 0 | 0 | 0 | 0 | 0 | 0 | 0 | 1 |
| 186 | 0 | 0 | 0 | 0 | 0 | 1 | 0 | 0 | 1 | 0 | 0 | 0 | 0 | 1 |
| 187 | 1 | 0 | 0 | 1 | 0 | 0 | 1 | 0 | 0 | 0 | 0 | 0 | 0 | 1 |
| 188 | 0 | 1 | 0 | 0 | 0 | 0 | 1 | 0 | 0 | 1 | 0 | 0 | 0 | 1 |
| 189 | 0 | 0 | 1 | 0 | 0 | 0 | 1 | 0 | 0 | 1 | 0 | 0 | 0 | 1 |
| 190 | 0 | 0 | 0 | 1 | 0 | 0 | 0 | 0 | 0 | 0 | 0 | 0 | 0 | 1 |
| 191 | 1 | 0 | 0 | 0 | 0 | 0 | 1 | 0 | 0 | 0 | 0 | 0 | 0 | 1 |
| 192 | 1 | 0 | 0 | 1 | 0 | 0 | 0 | 1 | 0 | 0 | 0 | 0 | 0 | 1 |
| 193 | 0 | 1 | 0 | 0 | 1 | 0 | 0 | 1 | 0 | 0 | 0 | 0 | 0 | 1 |
| 194 | 0 | 0 | 1 | 0 | 0 | 0 | 0 | 1 | 0 | 0 | 1 | 0 | 0 | 1 |
| 195 | 0 | 0 | 0 | 1 | 0 | 0 | 1 | 0 | 0 | 1 | 0 | 0 | 0 | 1 |
| 196 | 1 | 0 | 0 | 0 | 0 | 0 | 1 | 0 | 0 | 0 | 0 | 0 | 0 | 1 |
| 197 | 0 | 0 | 0 | 0 | 1 | 0 | 0 | 0 | 0 | 0 | 0 | 0 | 0 | 1 |
| 198 | 1 | 0 | 0 | 0 | 1 | 0 | 0 | 0 | 0 | 0 | 0 | 0 | 0 | 1 |
| 199 | 0 | 1 | 0 | 0 | 0 | 0 | 1 | 0 | 0 | 0 | 0 | 0 | 0 | 1 |
| 200 | 1 | 0 | 0 | 1 | 0 | 0 | 0 | 1 | 0 | 0 | 0 | 0 | 0 | 1 |
| 201 | 0 | 1 | 0 | 0 | 1 | 0 | 0 | 1 | 0 | 0 | 0 | 0 | 0 | 1 |
| 202 | 0 | 0 | 1 | 0 | 0 | 1 | 0 | 0 | 1 | 0 | 0 | 0 | 0 | 1 |
| 203 | 0 | 0 | 0 | 1 | 0 | 0 | 0 | 1 | 0 | 0 | 0 | 0 | 0 | 1 |
| 204 | 1 | 0 | 0 | 0 | 0 | 0 | 0 | 1 | 0 | 0 | 0 | 0 | 0 | 1 |
| 205 | 0 | 0 | 0 | 0 | 1 | 0 | 0 | 0 | 1 | 0 | 0 | 0 | 0 | 1 |
| 206 | 1 | 0 | 0 | 1 | 0 | 0 | 0 | 1 | 0 | 0 | 0 | 0 | 0 | 1 |
| 207 | 0 | 1 | 0 | 0 | 0 | 0 | 0 | 1 | 0 | 0 | 0 | 0 | 0 | 1 |
| 208 | 0 | 0 | 0 | 0 | 1 | 0 | 0 | 0 | 0 | 0 | 0 | 0 | 0 | 1 |
| 209 | 1 | 0 | 0 | 0 | 0 | 1 | 0 | 0 | 0 | 0 | 0 | 0 | 0 | 1 |
| 210 | 0 | 1 | 0 | 0 | 1 | 0 | 0 | 0 | 0 | 0 | 0 | 0 | 0 | 1 |
| 211 | 0 | 0 | 1 | 0 | 0 | 0 | 0 | 1 | 0 | 0 | 0 | 0 | 0 | 1 |
| 212 | 1 | 0 | 0 | 1 | 0 | 0 | 0 | 0 | 1 | 0 | 0 | 0 | 0 | 1 |
| 213 | 0 | 1 | 0 | 0 | 1 | 0 | 0 | 0 | 1 | 0 | 0 | 0 | 0 | 1 |
| 214 | 0 | 0 | 1 | 0 | 0 | 1 | 0 | 0 | 1 | 0 | 0 | 0 | 0 | 1 |
| 215 | 0 | 0 | 0 | 1 | 0 | 0 | 1 | 0 | 0 | 1 | 0 | 0 | 0 | 1 |

F I G. 3A

| | | | | | | | | | | | | | | |
|---|---|---|---|---|---|---|---|---|---|---|---|---|---|---|
| 216 | 1 | 0 | 0 | 0 | 0 | 0 | 0 | 0 | 1 | 0 | 0 | 0 | 0 | 1 |
| 217 | 0 | 0 | 0 | 0 | 1 | 0 | 0 | 0 | 1 | 0 | 0 | 0 | 0 | 1 |
| 218 | 1 | 0 | 0 | 0 | 1 | 0 | 0 | 0 | 1 | 0 | 0 | 0 | 0 | 1 |
| 219 | 0 | 1 | 0 | 0 | 0 | 0 | 0 | 0 | 1 | 0 | 0 | 0 | 0 | 1 |
| 220 | 0 | 0 | 0 | 0 | 0 | 1 | 0 | 0 | 1 | 0 | 0 | 0 | 0 | 1 |
| 221 | 1 | 0 | 0 | 0 | 1 | 0 | 0 | 0 | 1 | 0 | 0 | 0 | 0 | 1 |
| 222 | 0 | 1 | 0 | 0 | 0 | 1 | 0 | 0 | 1 | 0 | 0 | 0 | 0 | 1 |
| 223 | 0 | 0 | 1 | 0 | 0 | 0 | 0 | 0 | 1 | 0 | 0 | 0 | 0 | 1 |
| 224 | 0 | 0 | 0 | 0 | 0 | 1 | 0 | 0 | 0 | 0 | 0 | 0 | 0 | 1 |
| 225 | 1 | 0 | 0 | 1 | 0 | 0 | 1 | 0 | 0 | 1 | 0 | 0 | 0 | 1 |
| 226 | 0 | 1 | 0 | 0 | 0 | 1 | 0 | 0 | 0 | 0 | 0 | 0 | 0 | 1 |
| 227 | 0 | 0 | 1 | 0 | 0 | 0 | 1 | 0 | 0 | 0 | 0 | 0 | 0 | 1 |
| 228 | 0 | 0 | 0 | 1 | 0 | 0 | 0 | 0 | 1 | 0 | 0 | 0 | 0 | 1 |
| 229 | 1 | 0 | 0 | 0 | 0 | 0 | 1 | 0 | 0 | 1 | 0 | 0 | 0 | 1 |
| 230 | 1 | 0 | 0 | 1 | 0 | 0 | 0 | 0 | 0 | 0 | 1 | 0 | 0 | 1 |
| 231 | 0 | 1 | 0 | 0 | 1 | 0 | 0 | 0 | 0 | 0 | 1 | 0 | 0 | 1 |
| 232 | 0 | 0 | 1 | 0 | 0 | 1 | 0 | 0 | 0 | 0 | 1 | 0 | 0 | 1 |
| 233 | 0 | 0 | 0 | 1 | 0 | 0 | 1 | 0 | 0 | 0 | 1 | 0 | 0 | 1 |
| 234 | 1 | 0 | 0 | 0 | 0 | 0 | 0 | 0 | 0 | 0 | 1 | 0 | 0 | 1 |
| 235 | 0 | 0 | 0 | 0 | 1 | 0 | 0 | 1 | 0 | 0 | 1 | 0 | 0 | 1 |
| 236 | 1 | 0 | 0 | 0 | 1 | 0 | 0 | 1 | 0 | 0 | 1 | 0 | 0 | 1 |
| 237 | 0 | 1 | 0 | 0 | 0 | 0 | 0 | 0 | 0 | 0 | 1 | 0 | 0 | 1 |
| 238 | 0 | 0 | 0 | 0 | 0 | 1 | 0 | 0 | 0 | 0 | 1 | 0 | 0 | 1 |
| 239 | 1 | 0 | 0 | 0 | 0 | 1 | 0 | 0 | 0 | 0 | 1 | 0 | 0 | 1 |
| 240 | 0 | 1 | 0 | 0 | 0 | 1 | 0 | 0 | 0 | 0 | 1 | 0 | 0 | 1 |
| 241 | 0 | 0 | 1 | 0 | 0 | 0 | 0 | 0 | 0 | 0 | 1 | 0 | 0 | 1 |
| 242 | 0 | 0 | 0 | 0 | 0 | 0 | 1 | 0 | 0 | 0 | 1 | 0 | 0 | 1 |
| 243 | 1 | 0 | 0 | 1 | 0 | 0 | 1 | 0 | 0 | 0 | 1 | 0 | 0 | 1 |
| 244 | 0 | 1 | 0 | 0 | 0 | 0 | 1 | 0 | 0 | 0 | 1 | 0 | 0 | 1 |
| 245 | 0 | 0 | 1 | 0 | 0 | 0 | 1 | 0 | 0 | 0 | 1 | 0 | 0 | 1 |
| 246 | 0 | 0 | 0 | 1 | 0 | 0 | 0 | 0 | 0 | 0 | 1 | 0 | 0 | 1 |
| 247 | 1 | 0 | 0 | 0 | 0 | 0 | 1 | 0 | 0 | 0 | 1 | 0 | 0 | 1 |
| 248 | 1 | 0 | 0 | 1 | 0 | 0 | 0 | 1 | 0 | 0 | 1 | 0 | 0 | 1 |
| 249 | 0 | 1 | 0 | 0 | 1 | 0 | 0 | 1 | 0 | 0 | 1 | 0 | 0 | 1 |
| 250 | 0 | 0 | 1 | 0 | 0 | 0 | 0 | 1 | 0 | 0 | 0 | 0 | 0 | 1 |
| 251 | 0 | 0 | 0 | 1 | 0 | 0 | 1 | 0 | 0 | 0 | 0 | 0 | 0 | 1 |
| 252 | 1 | 0 | 0 | 0 | 0 | 0 | 1 | 0 | 0 | 1 | 0 | 0 | 0 | 1 |
| 253 | 0 | 0 | 0 | 0 | 1 | 0 | 0 | 0 | 0 | 1 | 0 | 0 | 0 | 1 |
| 254 | 1 | 0 | 0 | 0 | 1 | 0 | 0 | 0 | 0 | 1 | 0 | 0 | 0 | 1 |
| 255 | 0 | 1 | 0 | 0 | 0 | 0 | 0 | 1 | 0 | 0 | 1 | 0 | 0 | 1 |

FIG. 3B

TABLE D ( 34 CODES )

| | | | | | | | | | | | | | |
|---|---|---|---|---|---|---|---|---|---|---|---|---|---|
| 0  | 0 | 0 | 0 | 1 | 0 | 0 | 1 | 0 | 0 | 0 | 1 | 0 | 0 | 1 |
| 1  | 1 | 0 | 0 | 0 | 0 | 0 | 0 | 0 | 0 | 0 | 1 | 0 | 0 | 1 |
| 2  | 0 | 0 | 0 | 0 | 1 | 0 | 0 | 1 | 0 | 0 | 1 | 0 | 0 | 1 |
| 3  | 1 | 0 | 0 | 0 | 1 | 0 | 0 | 1 | 0 | 0 | 1 | 0 | 0 | 1 |
| 4  | 0 | 1 | 0 | 0 | 0 | 0 | 0 | 0 | 0 | 0 | 1 | 0 | 0 | 1 |
| 5  | 1 | 0 | 0 | 0 | 0 | 1 | 0 | 0 | 1 | 0 | 0 | 1 | 0 | 0 | 1 |
| 6  | 0 | 1 | 0 | 0 | 0 | 1 | 0 | 0 | 1 | 0 | 0 | 1 | 0 | 0 | 1 |
| 7  | 0 | 0 | 1 | 0 | 0 | 0 | 0 | 0 | 0 | 0 | 1 | 0 | 0 | 1 |
| 8  | 0 | 0 | 0 | 0 | 0 | 0 | 1 | 0 | 0 | 0 | 1 | 0 | 0 | 1 |
| 9  | 1 | 0 | 0 | 1 | 0 | 0 | 1 | 0 | 0 | 0 | 1 | 0 | 0 | 1 |
| 10 | 0 | 1 | 0 | 0 | 0 | 0 | 1 | 0 | 0 | 0 | 1 | 0 | 0 | 1 |
| 11 | 0 | 0 | 1 | 0 | 0 | 0 | 1 | 0 | 0 | 0 | 1 | 0 | 0 | 1 |
| 12 | 0 | 0 | 0 | 1 | 0 | 0 | 0 | 0 | 0 | 0 | 1 | 0 | 0 | 1 |
| 13 | 1 | 0 | 0 | 0 | 0 | 0 | 1 | 0 | 0 | 0 | 1 | 0 | 0 | 1 |
| 14 | 1 | 0 | 0 | 1 | 0 | 0 | 0 | 1 | 0 | 0 | 1 | 0 | 0 | 1 |
| 15 | 0 | 1 | 0 | 0 | 1 | 0 | 0 | 1 | 0 | 0 | 1 | 0 | 0 | 1 |
| 16 | 0 | 0 | 1 | 0 | 0 | 0 | 0 | 1 | 0 | 0 | 1 | 0 | 0 | 1 |
| 17 | 0 | 0 | 0 | 1 | 0 | 0 | 0 | 1 | 0 | 0 | 1 | 0 | 0 | 1 |
| 18 | 1 | 0 | 0 | 0 | 0 | 0 | 0 | 1 | 0 | 0 | 1 | 0 | 0 | 1 |
| 19 | 0 | 0 | 0 | 0 | 1 | 0 | 0 | 0 | 0 | 0 | 1 | 0 | 0 | 1 |
| 20 | 1 | 0 | 0 | 0 | 1 | 0 | 0 | 0 | 0 | 0 | 1 | 0 | 0 | 1 |
| 21 | 0 | 1 | 0 | 0 | 0 | 0 | 1 | 0 | 0 | 0 | 1 | 0 | 0 | 1 |
| 22 | 1 | 0 | 0 | 1 | 0 | 0 | 0 | 1 | 0 | 0 | 1 | 0 | 0 | 1 |
| 23 | 0 | 1 | 0 | 0 | 1 | 0 | 0 | 1 | 0 | 0 | 1 | 0 | 0 | 1 |
| 24 | 0 | 0 | 1 | 0 | 0 | 1 | 0 | 0 | 1 | 0 | 0 | 1 | 0 | 0 | 1 |
| 25 | 0 | 0 | 0 | 1 | 0 | 0 | 0 | 1 | 0 | 0 | 1 | 0 | 0 | 1 |
| 26 | 1 | 0 | 0 | 0 | 0 | 0 | 0 | 1 | 0 | 0 | 1 | 0 | 0 | 1 |
| 27 | 0 | 0 | 0 | 0 | 1 | 0 | 0 | 1 | 0 | 0 | 1 | 0 | 0 | 1 |
| 28 | 1 | 0 | 0 | 0 | 1 | 0 | 0 | 1 | 0 | 0 | 1 | 0 | 0 | 1 |
| 29 | 0 | 1 | 0 | 0 | 0 | 0 | 0 | 1 | 0 | 0 | 1 | 0 | 0 | 1 |
| 30 | 0 | 0 | 0 | 0 | 1 | 0 | 0 | 0 | 0 | 0 | 1 | 0 | 0 | 1 |
| 31 | 1 | 0 | 0 | 0 | 0 | 1 | 0 | 0 | 0 | 0 | 1 | 0 | 0 | 1 |
| 32 | 0 | 1 | 0 | 0 | 0 | 1 | 0 | 0 | 0 | 0 | 1 | 0 | 0 | 1 |
| 33 | 0 | 0 | 1 | 0 | 0 | 0 | 0 | 0 | 1 | 0 | 0 | 1 | 0 | 0 | 1 |

F I G. 4

TABLE E ( 17 CODES)

| | | |
|---|---|---|
| 1 | 0 0 1 0 0 1 0 0 0 0 0 0 0 1 |
| 3 | 0 0 1 0 0 0 1 0 0 0 0 0 0 1 |
| 5 | 0 0 1 0 0 0 0 1 0 0 0 0 0 1 |
| 1 3 | 0 0 1 0 0 1 0 0 1 0 0 0 0 1 |
| 2 0 | 0 0 1 0 0 0 1 0 0 1 0 0 0 1 |
| 3 1 | 0 0 1 0 0 0 0 1 0 0 1 0 0 1 |
| 4 7 | 0 0 1 0 0 0 0 0 1 0 0 1 0 1 |
| 7 1 | 0 0 1 0 0 0 0 0 0 1 0 0 0 1 |
| 7 5 | 0 0 1 0 0 1 0 0 0 1 0 0 0 1 |
| 1 0 6 | 0 0 1 0 0 0 0 0 0 0 1 0 0 1 |
| 1 1 0 | 0 0 1 0 0 1 0 0 0 0 1 0 0 1 |
| 1 1 2 | 0 0 1 0 0 0 1 0 0 0 1 0 0 1 |
| 1 7 8 | 0 0 0 1 0 0 1 0 0 0 0 0 0 1 |
| 1 8 0 | 0 0 0 0 1 0 0 1 0 0 0 0 0 1 |
| 1 8 3 | 0 0 0 0 0 1 0 0 1 0 0 0 0 1 |
| 1 8 7 | 0 0 0 0 0 0 1 0 0 1 0 0 0 1 |
| 1 9 1 | 0 0 0 1 0 0 0 0 0 0 0 0 0 1 |

F I G. 5

TABLE F ( 86 CODES)

| # | | | | | | | | | | | | | | |
|---|---|---|---|---|---|---|---|---|---|---|---|---|---|---|
| 1 | 0 | 0 | 0 | 1 | 0 | 0 | 1 | 0 | 0 | 0 | 0 | 0 | 0 | 0 |
| 3 | 0 | 0 | 0 | 0 | 1 | 0 | 0 | 1 | 0 | 0 | 0 | 0 | 0 | 0 |
| 5 | 0 | 0 | 0 | 0 | 0 | 1 | 0 | 0 | 1 | 0 | 0 | 0 | 0 | 0 |
| 9 | 0 | 0 | 0 | 0 | 0 | 0 | 1 | 0 | 0 | 1 | 0 | 0 | 0 | 0 |
| 13 | 0 | 0 | 0 | 1 | 0 | 0 | 0 | 0 | 0 | 0 | 0 | 0 | 0 | 0 |
| 14 | 0 | 0 | 0 | 0 | 0 | 0 | 1 | 0 | 0 | 1 | 0 | 0 | 0 | 0 |
| 18 | 0 | 0 | 0 | 1 | 0 | 0 | 1 | 0 | 0 | 1 | 0 | 0 | 0 | 0 |
| 20 | 0 | 0 | 0 | 0 | 1 | 0 | 0 | 0 | 0 | 0 | 0 | 0 | 0 | 0 |
| 22 | 0 | 0 | 0 | 0 | 0 | 0 | 0 | 1 | 0 | 0 | 1 | 0 | 0 | 0 |
| 26 | 0 | 0 | 0 | 1 | 0 | 0 | 0 | 1 | 0 | 0 | 1 | 0 | 0 | 0 |
| 28 | 0 | 0 | 0 | 0 | 1 | 0 | 0 | 1 | 0 | 0 | 1 | 0 | 0 | 0 |
| 31 | 0 | 0 | 0 | 0 | 0 | 1 | 0 | 0 | 0 | 0 | 0 | 0 | 0 | 0 |
| 34 | 0 | 0 | 0 | 0 | 0 | 0 | 0 | 0 | 1 | 0 | 0 | 1 | 0 | 0 |
| 38 | 0 | 0 | 0 | 1 | 0 | 0 | 1 | 0 | 0 | 1 | 0 | 0 | 0 | 0 |
| 40 | 0 | 0 | 0 | 0 | 1 | 0 | 0 | 0 | 1 | 0 | 0 | 1 | 0 | 0 |
| 43 | 0 | 0 | 0 | 0 | 0 | 1 | 0 | 0 | 1 | 0 | 0 | 1 | 0 | 0 |
| 47 | 0 | 0 | 0 | 0 | 0 | 0 | 1 | 0 | 0 | 0 | 0 | 0 | 0 | 0 |
| 51 | 0 | 0 | 0 | 1 | 0 | 0 | 0 | 0 | 1 | 0 | 0 | 0 | 0 | 0 |
| 52 | 0 | 0 | 0 | 0 | 0 | 0 | 0 | 0 | 0 | 1 | 0 | 0 | 0 | 0 |
| 56 | 0 | 0 | 0 | 1 | 0 | 0 | 1 | 0 | 0 | 1 | 0 | 0 | 0 | 0 |
| 58 | 0 | 0 | 0 | 0 | 1 | 0 | 0 | 1 | 0 | 0 | 1 | 0 | 0 | 0 |
| 61 | 0 | 0 | 0 | 0 | 0 | 1 | 0 | 0 | 0 | 0 | 1 | 0 | 0 | 0 |
| 65 | 0 | 0 | 0 | 0 | 0 | 0 | 1 | 0 | 0 | 1 | 0 | 0 | 0 | 0 |
| 69 | 0 | 0 | 0 | 1 | 0 | 0 | 0 | 0 | 0 | 1 | 0 | 0 | 0 | 0 |
| 71 | 0 | 0 | 0 | 0 | 0 | 0 | 0 | 1 | 0 | 0 | 0 | 0 | 0 | 0 |
| 75 | 0 | 0 | 0 | 1 | 0 | 0 | 1 | 0 | 0 | 0 | 0 | 0 | 0 | 0 |
| 77 | 0 | 0 | 0 | 0 | 1 | 0 | 0 | 0 | 0 | 1 | 0 | 0 | 0 | 0 |
| 79 | 0 | 0 | 0 | 0 | 0 | 0 | 0 | 0 | 0 | 0 | 1 | 0 | 0 | 0 |
| 83 | 0 | 0 | 0 | 1 | 0 | 0 | 1 | 0 | 0 | 0 | 1 | 0 | 0 | 0 |
| 85 | 0 | 0 | 0 | 0 | 1 | 0 | 0 | 1 | 0 | 0 | 1 | 0 | 0 | 0 |
| 88 | 0 | 0 | 0 | 0 | 0 | 1 | 0 | 0 | 1 | 0 | 0 | 1 | 0 | 0 |
| 92 | 0 | 0 | 0 | 0 | 0 | 0 | 1 | 0 | 0 | 0 | 1 | 0 | 0 | 0 |
| 96 | 0 | 0 | 0 | 1 | 0 | 0 | 0 | 0 | 0 | 0 | 1 | 0 | 0 | 0 |
| 98 | 0 | 0 | 0 | 0 | 0 | 0 | 0 | 0 | 1 | 0 | 0 | 1 | 0 | 0 |
| 102 | 0 | 0 | 0 | 1 | 0 | 0 | 1 | 0 | 0 | 1 | 0 | 0 | 0 | 0 |
| 104 | 0 | 0 | 0 | 0 | 1 | 0 | 0 | 0 | 0 | 0 | 1 | 0 | 0 | 0 |
| 106 | 0 | 0 | 0 | 0 | 0 | 0 | 0 | 1 | 0 | 0 | 0 | 0 | 0 | 0 |
| 110 | 0 | 0 | 0 | 1 | 0 | 0 | 0 | 1 | 0 | 0 | 0 | 0 | 0 | 0 |
| 112 | 0 | 0 | 0 | 0 | 1 | 0 | 0 | 1 | 0 | 0 | 0 | 0 | 0 | 0 |
| 115 | 0 | 0 | 0 | 0 | 0 | 1 | 0 | 0 | 0 | 0 | 1 | 0 | 0 | 0 |
| 118 | 0 | 0 | 0 | 0 | 0 | 0 | 0 | 0 | 0 | 0 | 0 | 1 | 0 | 0 |

FIG. 6A

| | |
|---|---|
| 1 2 2 | 0 0 0 1 0 0 1 0 0 0 0 0 1 0 0 |
| 1 2 4 | 0 0 0 0 1 0 0 1 0 0 0 0 1 0 0 |
| 1 2 7 | 0 0 0 0 0 1 0 0 1 0 0 0 1 0 0 |
| 1 3 1 | 0 0 0 0 0 0 1 0 0 1 0 0 1 0 0 |
| 1 3 5 | 0 0 0 1 0 0 0 0 0 0 0 0 1 0 0 |
| 1 3 7 | 0 0 0 0 0 0 0 1 0 0 0 0 1 0 0 |
| 1 4 1 | 0 0 0 1 0 0 0 1 0 0 0 0 1 0 0 |
| 1 4 3 | 0 0 0 0 1 0 0 0 0 0 0 0 1 0 0 |
| 1 4 5 | 0 0 0 0 0 0 0 0 1 0 0 0 1 0 0 |
| 1 4 9 | 0 0 0 1 0 0 0 0 1 0 0 0 1 0 0 |
| 1 5 1 | 0 0 0 0 1 0 0 0 1 0 0 0 1 0 0 |
| 1 5 4 | 0 0 0 0 0 1 0 0 0 0 0 0 1 0 0 |
| 1 5 7 | 0 0 0 0 0 0 0 0 1 0 0 0 0 0 0 |
| 1 6 1 | 0 0 0 1 0 0 1 0 0 1 0 0 1 0 0 |
| 1 6 3 | 0 0 0 0 1 0 0 0 0 1 0 0 0 0 0 |
| 1 6 6 | 0 0 0 0 0 1 0 0 0 1 0 0 0 0 0 |
| 1 7 0 | 0 0 0 0 0 0 1 0 0 0 0 0 1 0 0 |
| 1 7 4 | 0 0 0 1 0 0 0 0 1 0 0 1 0 0 |
| 1 7 8 | 0 0 1 0 0 1 0 0 0 0 0 0 0 0 |
| 1 8 0 | 0 0 1 0 0 0 1 0 0 0 0 0 0 0 |
| 1 8 3 | 0 0 1 0 0 0 0 1 0 0 0 0 0 0 |
| 1 8 7 | 0 0 1 0 0 0 0 0 1 0 0 0 0 0 |
| 1 9 1 | 0 0 1 0 0 1 0 0 1 0 0 0 0 0 |
| 1 9 2 | 0 0 1 0 0 0 0 0 0 1 0 0 0 0 |
| 1 9 6 | 0 0 1 0 0 1 0 0 0 1 0 0 0 0 |
| 1 9 8 | 0 0 1 0 0 0 1 0 0 1 0 0 0 0 |
| 2 0 0 | 0 0 1 0 0 0 0 0 0 0 1 0 0 0 0 |
| 2 0 4 | 0 0 1 0 0 1 0 0 0 0 1 0 0 0 0 |
| 2 0 6 | 0 0 1 0 0 0 1 0 0 0 1 0 0 0 0 |
| 2 0 9 | 0 0 1 0 0 0 0 1 0 0 1 0 0 0 0 |
| 2 1 2 | 0 0 1 0 0 0 0 0 0 0 0 1 0 0 0 |
| 2 1 6 | 0 0 1 0 0 1 0 0 0 0 0 1 0 0 0 |
| 2 1 8 | 0 0 1 0 0 0 1 0 0 0 0 1 0 0 0 |
| 2 2 1 | 0 0 1 0 0 0 0 1 0 0 0 1 0 0 0 |
| 2 2 5 | 0 0 1 0 0 0 0 0 1 0 0 1 0 0 0 |
| 2 2 9 | 0 0 1 0 0 1 0 0 1 0 0 1 0 0 0 |
| 2 3 0 | 0 0 1 0 0 0 0 0 0 0 0 0 1 0 0 |
| 2 3 4 | 0 0 1 0 0 1 0 0 0 0 0 0 1 0 0 |
| 2 3 6 | 0 0 1 0 0 0 1 0 0 0 0 0 1 0 0 |
| 2 3 9 | 0 0 1 0 0 0 0 1 0 0 0 0 1 0 0 |
| 2 4 3 | 0 0 1 0 0 0 0 0 1 0 0 0 1 0 0 |
| 2 4 7 | 0 0 1 0 0 1 0 0 1 0 0 0 1 0 0 |
| 2 4 8 | 0 0 1 0 0 0 0 0 0 1 0 0 1 0 0 |

FIG. 6B

| | |
|---|---|
| 2 5 2 | 0 0 1 0 0 1 0 0 0 1 0 0 1 0 0 |
| 2 5 4 | 0 0 1 0 0 0 1 0 0 1 0 0 1 0 0 |

FIG. 6C

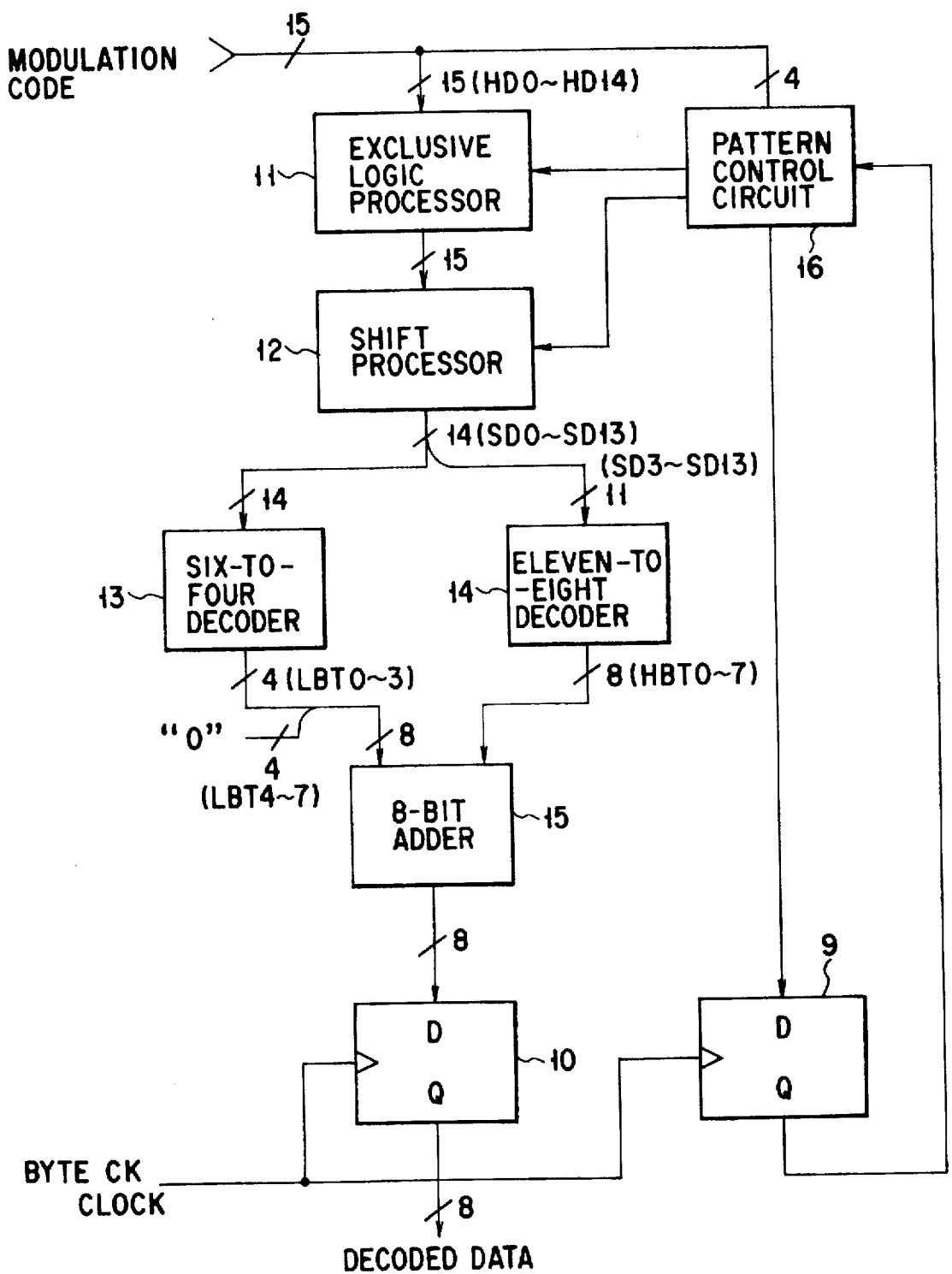
F I G. 8

TABLE F (86 CODES)

| SOURCE CODE | HD<br>　　　　　11111<br>012345678901234 | SD<br>　　　　　1111<br>01234567890123 |
|---|---|---|
| | | EXCLUSIVE LOGIC PROCESS |
| 1 | 000100100000000 | *00100000000000 |
| 3 | 000010010000000 | *00010000000000 |
| 5 | 000001001000000 | *00001000000000 |
| 9 | 000000100100000 | *00000010000000 |
| 13 | 000100000000000 | *00100010000000 |
| 14 | 000000010010000 | *00000001000000 |
| 18 | 000100010010000 | *00100001000000 |
| 20 | 000010000000000 | *00010001000000 |
| 22 | 000000001001000 | *00000000100000 |
| 26 | 000100001001000 | *00100000100000 |
| 28 | 000010001001000 | *00010000100000 |
| 31 | 000001000000000 | *00000100100000 |
| 34 | 000000000100100 | *00000000010000 |
| 38 | 000100100100000 | *00100000010000 |
| 40 | 000010000100100 | *00010000010000 |
| 43 | 000001000100100 | *00001000010000 |
| 47 | 000000100000000 | *00000010010000 |
| 51 | 000100000100000 | *00100010010000 |
| 52 | 000000000010000 | *00000000001000 |
| 56 | 000100100010000 | *00100000001000 |
| 58 | 000010010010000 | *00010000001000 |
| 61 | 000001000010000 | *00000100001000 |
| 65 | 000000100010000 | *00000010001000 |
| 69 | 000100000010000 | *00100010001000 |
| 71 | 000000010000000 | *00000001001000 |
| 75 | 000100010000000 | *00100001001000 |
| 77 | 000010000010000 | *00010001001000 |
| 79 | 000000000001000 | *00000000000100 |
| 83 | 000100100001000 | *00100000000100 |
| 85 | 000010010001000 | *00010000000100 |
| 88 | 000001001001000 | *00001000000100 |
| 92 | 000000100001000 | *00000010000100 |
| 96 | 000100000001000 | *00100010000100 |
| 98 | 000000010001000 | *00000001000100 |
| 102 | 000100010001000 | *00100001000100 |
| 104 | 000010000001000 | *00010001000100 |
| 106 | 000000001000000 | *00000000100100 |
| 110 | 000100001000000 | *00100000100100 |
| 112 | 000010001000000 | *00010000100100 |
| 115 | 000001000001000 | *00000100100100 |
| 118 | 000000000000100 | *00000000000010 |
| 122 | 000100100000100 | *00100000000010 |
| 124 | 000010010000100 | *00010000000010 |

FIG. 11A

| SOURCE CODE | HD<br>            11111<br>012345678901234 | SD<br>           1111<br>01234567890123 |
|---|---|---|
| 1 2 7 | 000001001000100 | ‡00001000000010 |
| 1 3 1 | 000000100100100 | ‡00000010000010 |
| 1 3 5 | 000100000000100 | ‡00100010000010 |
| 1 3 7 | 000000010000100 | ‡00000001000010 |
| 1 4 1 | 000100010000100 | ‡00100001000010 |
| 1 4 3 | 000010000000100 | ‡00010001000010 |
| 1 4 5 | 000000001000100 | ‡00000000100010 |
| 1 4 9 | 000100001000100 | ‡00100000100010 |
| 1 5 1 | 000010001000100 | ‡00010000100010 |
| 1 5 4 | 000001000000100 | ‡00000100100010 |
| 1 5 7 | 000000000100000 | ‡00000000010010 |
| 1 6 1 | 000100100100100 | ‡00100000010010 |
| 1 6 3 | 000010000100000 | ‡00010000010010 |
| 1 6 6 | 000001000100000 | ‡00001000010010 |
| 1 7 0 | 000000100000100 | ‡00000100010010 |
| 1 7 4 | 000100000100100 | ‡00100100010010 |
|  |  | BIT SHIFT PROCESS |
| 1 7 8 | 001001000000000 | 1001000000000‡ |
| 1 8 0 | 001000100000000 | 1000100000000‡ |
| 1 8 3 | 001000010000000 | 1000010000000‡ |
| 1 8 7 | 001000001000000 | 1000001000000‡ |
| 1 9 1 | 001001001000000 | 1001001000000‡ |
| 1 9 2 | 001000000100000 | 1000000100000‡ |
| 1 9 6 | 001001000100000 | 1001000100000‡ |
| 1 9 8 | 001000100100000 | 1000100100000‡ |
| 2 0 0 | 001000000010000 | 1000000010000‡ |
| 2 0 4 | 001001000010000 | 1001000010000‡ |
| 2 0 6 | 001000100010000 | 1000100010000‡ |
| 2 0 9 | 001000010010000 | 1000010010000‡ |
| 2 1 2 | 001000000001000 | 1000000001000‡ |
| 2 1 6 | 001001000001000 | 1001000001000‡ |
| 2 1 8 | 001000100001000 | 1000100001000‡ |
| 2 2 1 | 001000010001000 | 1000010001000‡ |
| 2 2 5 | 001000001001000 | 1000001001000‡ |
| 2 2 9 | 001001001001000 | 1001001001000‡ |
| 2 3 0 | 001000000000100 | 1000000000100‡ |
| 2 3 4 | 001001000000100 | 1001000000100‡ |
| 2 3 6 | 001000100000100 | 1000100000100‡ |
| 2 3 9 | 001000010000100 | 1000010000100‡ |
| 2 4 3 | 001000001000100 | 1000001000100‡ |
| 2 4 7 | 001001001000100 | 1001001000100‡ |
| 2 4 8 | 001000000100100 | 1000000100100‡ |
| 2 5 2 | 001001000100100 | 1001000100100‡ |
| 2 5 4 | 001000100100100 | 1000100100100‡ |

FIG. 11B

※ : EITHER "0" OR "1"

FIG. 12

| SD | | | | | | | | | | | | | | OUTPUT | | | | |
|---|---|---|---|---|---|---|---|---|---|---|---|---|---|---|---|---|---|---|
| 13 | 12 | 11 | 10 | 9 | 8 | 7 | 6 | 5 | 4 | 3 | 2 | 1 | 0 | LBT 3 | LBT 2 | LBT 1 | LBT 0 | DECIMAL DISPLAY |
| ALL "0" | | | | | | | | ※ | ※ | ※ | 0 | 0 | 0 | 0 | 0 | 1 | 0 | 0 |
| ALL "0" | | | | | | | | ※ | ※ | ※ | 0 | 0 | 1 | 0 | 0 | 0 | 1 | 1 |
| ALL "0" | | | | | | | | ※ | ※ | ※ | 0 | 1 | 0 | 0 | 0 | 0 | 2 | 2 |
| ALL "0" | | | | | | | | ※ | ※ | ※ | 1 | 0 | 0 | 0 | 0 | 1 | 3 | 3 |
| ALL EXCEPT "0" | | | | | | | | 0 | 0 | 1 | 0 | 0 | 0 | 0 | 0 | 1 | 0 | 0 |
| ALL EXCEPT "0" | | | | | | | | 0 | 0 | 1 | 0 | 0 | 1 | 0 | 0 | 0 | 1 | 1 |
| ALL EXCEPT "0" | | | | | | | | 0 | 1 | 0 | 0 | 0 | 0 | 0 | 0 | 1 | 0 | 2 |
| ALL EXCEPT "0" | | | | | | | | 0 | 1 | 0 | 1 | 0 | 0 | 0 | 1 | 0 | 1 | 3 |
| ALL EXCEPT "0" | | | | | | | | 0 | 1 | 0 | 0 | 0 | 0 | 0 | 1 | 0 | 0 | 4 |
| ALL EXCEPT "0" | | | | | | | | 1 | 0 | 0 | 0 | 0 | 0 | 1 | 0 | 1 | 1 | 5 |
| ALL EXCEPT "0" | | | | | | | | 1 | 0 | 0 | 0 | 0 | 1 | 1 | 0 | 1 | 0 | 6 |
| ALL EXCEPT "0" | | | | | | | | 1 | 0 | 0 | 0 | 1 | 0 | 1 | 1 | 0 | 1 | 7 |
| ALL EXCEPT "0" | | | | | | | | 1 | 0 | 0 | 1 | 0 | 0 | 0 | 1 | 0 | 0 | 8 |
| ALL EXCEPT "0" | | | | | | | | 1 | 0 | 0 | 0 | 0 | 1 | 0 | 0 | 1 | 1 | 9 |
| ALL EXCEPT "0" | | | | | | | | 1 | 0 | 0 | 1 | 1 | 0 | 1 | 1 | 1 | 0 | 10 |
| ALL EXCEPT "0" | | | | | | | | 1 | 0 | 0 | 0 | 0 | 0 | 1 | 1 | 1 | 1 | 11 |
| ALL EXCEPT "0" | | | | | | | | 1 | 0 | 0 | 1 | 0 | 0 | 1 | 1 | 0 | 0 | 12 |

| CONVERTED VALUE | | | | | | | | |
|---|---|---|---|---|---|---|---|---|
| 1 | 2 | 3 | 4 | 6 | 9 | ... | | |

| SD | | | | | | | | | | | OUTPUT HBT | | | | | | | | DECIMAL DISPLAY |
|---|---|---|---|---|---|---|---|---|---|---|---|---|---|---|---|---|---|---|---|
| 3 | 4 | 5 | 6 | 7 | 8 | 9 | 10 | 11 | 12 | 13 | 7 | 6 | 5 | 4 | 3 | 2 | 1 | 0 | |
| 1 | 0 | 0 | ALL "0" | | | | | | | | 0 | 0 | 0 | 0 | 0 | 0 | 0 | 0 | 0 |
| 0 | 1 | 0 | | | | | | | | | 0 | 0 | 0 | 0 | 0 | 0 | 1 | 0 | 2 |
| 0 | 0 | 1 | | | | | | | | | 0 | 0 | 0 | 0 | 0 | 1 | 0 | 0 | 4 |
| ※ | ※ | ※ | 1 | 0 | 0 | 0 | 0 | 0 | 0 | 0 | 0 | 0 | 0 | 0 | 1 | 0 | 0 | 0 | 8 |
| ※ | ※ | ※ | 0 | 1 | 0 | 0 | 0 | 0 | 0 | 0 | 0 | 0 | 0 | 0 | 1 | 1 | 0 | 1 | 13 |
| ※ | ※ | ※ | 0 | 0 | 1 | 0 | 0 | 0 | 0 | 0 | 0 | 0 | 0 | 1 | 0 | 1 | 0 | 1 | 21 |
| ※ | ※ | ※ | 0 | 0 | 0 | 1 | 0 | 0 | 0 | 0 | 0 | 0 | 1 | 0 | 0 | 0 | 0 | 1 | 33 |
| ※ | ※ | ※ | 1 | 0 | 0 | 1 | 0 | 0 | 0 | 0 | 0 | 0 | 1 | 0 | 1 | 1 | 1 | 0 | 46 |
| ※ | ※ | ※ | 0 | 0 | 0 | 0 | 1 | 0 | 0 | 0 | 0 | 0 | 1 | 1 | 0 | 0 | 1 | 1 | 51 |
| ※ | ※ | ※ | 1 | 0 | 0 | 0 | 1 | 0 | 0 | 0 | 0 | 1 | 0 | 0 | 0 | 0 | 0 | 0 | 64 |
| ※ | ※ | ※ | 0 | 1 | 0 | 0 | 1 | 0 | 0 | 0 | 0 | 1 | 0 | 0 | 0 | 1 | 1 | 0 | 70 |
| ※ | ※ | ※ | 0 | 0 | 0 | 0 | 0 | 1 | 0 | 0 | 0 | 1 | 0 | 0 | 1 | 1 | 1 | 0 | 78 |
| ※ | ※ | ※ | 1 | 0 | 0 | 0 | 0 | 1 | 0 | 0 | 0 | 1 | 0 | 1 | 1 | 0 | 1 | 1 | 91 |
| ※ | ※ | ※ | 0 | 1 | 0 | 0 | 0 | 1 | 0 | 0 | 0 | 1 | 1 | 0 | 0 | 0 | 0 | 1 | 97 |
| ※ | ※ | ※ | 0 | 0 | 1 | 0 | 0 | 1 | 0 | 0 | 0 | 1 | 1 | 0 | 1 | 0 | 0 | 1 | 105 |
| ※ | ※ | ※ | 0 | 0 | 0 | 0 | 0 | 0 | 1 | 0 | 0 | 1 | 1 | 1 | 0 | 1 | 0 | 1 | 117 |
| ※ | ※ | ※ | 1 | 0 | 0 | 0 | 0 | 0 | 1 | 0 | 1 | 0 | 0 | 0 | 0 | 0 | 1 | 0 | 130 |
| ※ | ※ | ※ | 0 | 1 | 0 | 0 | 0 | 0 | 1 | 0 | 1 | 0 | 0 | 0 | 1 | 0 | 0 | 0 | 136 |
| ※ | ※ | ※ | 0 | 0 | 1 | 0 | 0 | 0 | 1 | 0 | 1 | 0 | 0 | 1 | 0 | 0 | 0 | 0 | 144 |
| ※ | ※ | ※ | 0 | 0 | 0 | 1 | 0 | 0 | 1 | 0 | 1 | 0 | 0 | 1 | 1 | 1 | 0 | 0 | 156 |
| ※ | ※ | ※ | 1 | 0 | 0 | 1 | 0 | 0 | 1 | 0 | 1 | 0 | 1 | 0 | 1 | 0 | 0 | 1 | 169 |
| ※ | ※ | ※ | 0 | 0 | 0 | 0 | 0 | 0 | 0 | 1 | 1 | 0 | 1 | 0 | 1 | 1 | 0 | 1 | 173 |
| ※ | ※ | ※ | 1 | 0 | 0 | 0 | 0 | 0 | 0 | 1 | 1 | 0 | 1 | 1 | 1 | 0 | 1 | 0 | 186 |
| ※ | ※ | ※ | 0 | 1 | 0 | 0 | 0 | 0 | 0 | 1 | 1 | 0 | 1 | 1 | 1 | 1 | 1 | 1 | 191 |
| ※ | ※ | ※ | 0 | 0 | 1 | 0 | 0 | 0 | 0 | 1 | 1 | 1 | 0 | 0 | 0 | 1 | 1 | 1 | 199 |
| ※ | ※ | ※ | 0 | 0 | 0 | 1 | 0 | 0 | 0 | 1 | 1 | 1 | 0 | 1 | 0 | 0 | 1 | 1 | 211 |
| ※ | ※ | ※ | 1 | 0 | 0 | 1 | 0 | 0 | 0 | 1 | 1 | 1 | 1 | 0 | 0 | 0 | 0 | 0 | 224 |
| ※ | ※ | ※ | 0 | 0 | 0 | 0 | 1 | 0 | 0 | 1 | 1 | 1 | 1 | 0 | 0 | 1 | 0 | 1 | 229 |
| ※ | ※ | ※ | 1 | 0 | 0 | 0 | 1 | 0 | 0 | 1 | 1 | 1 | 1 | 1 | 0 | 0 | 1 | 0 | 242 |
| ※ | ※ | ※ | 0 | 1 | 0 | 0 | 1 | 0 | 0 | 1 | 1 | 1 | 1 | 0 | 1 | 1 | 1 | 1 | 247 |

| | | | | | | | | | | | | |
|---|---|---|---|---|---|---|---|---|---|---|---|---|
| 0 | 2 | 4 | 8 | 13 | 21 | 33 | 51 | 78 | 117 | 173 | | RIGHTMOST END BIT CONVERTED VALUE |
| | | | 13 | 19 | 27 | 39 | | | | | CASE OF SD13=0 | CONVERTED VALUE EXCEPT ABOVE BIT |
| | | | | 18 | 26 | 38 | 56 | | | | CASE OF SD13=1 | |

※ : EITHER "0" OR "1"

F I G. 14

DATA DECODING APPARATUS AND METHOD AND RECORDING MEDIUM

BACKGROUND OF THE INVENTION

1. Field of the Invention

This invention relates to a data decoding apparatus that fetches a signal from a recording medium such as an optical disk, which records digital data by using specific modulation techniques, and converts the modulated data to the original digital data, to a corresponding method of data decoding, and to a recording medium that records these data.

2. Description of the Related Art

With recent advances of digital compression technology, digitized video and audio data can be recorded on storage media such as optical disks. Specifically, a next-generation video disk called a "DVD (Digital Video Disk)" can store sharp video beyond what can be found in conventional video equipment in a small-diameter disk. However, the performance required for the DVD is not only high-efficiency compression technology. Because of the necessity of recording video and audio for up to two hours or more, it is absolutely indispensable to enhance the density of the disk itself.

The recording density of the disk is not only dependent on the physical surface density, which can be enhanced by merely shortening the pit length and narrowing the track pitch, but also by considering the limit in the optical properties such as the laser wavelength, the NA of a lens, etc. To increase the storage density of the disk as much as possible in the present optical systems, it is also important to improve the modulation techniques related to signal processing.

SUMMARY OF THE INVENTION

Accordingly, the present invention achieves a modulation code that is appropriate for utilizing the high density of the disk and for enhancing the density of disk recording without substantially enlarging the scale of the decoding processor. The object of the present invention is to provide an apparatus for decoding data which can easily restore a modulation code having a long bit length to an original source code, a method of decoding data, and a recording medium which records the modulation code.

To accomplish the foregoing object, according to one preferred aspect of the invention, an apparatus for decoding data comprises a plurality of numeric value converting means for dividing an m-bit code into a plurality of blocks (divided to m blocks at the maximum) and for converting it into a predetermined numeric value code corresponding to the bit position for generating a "1" (in the case of positive logic) in the respective blocks, and further comprising numerical data processing means for adding or subtracting the numeric value codes obtained by said numeric value converting means.

According to the above-described means, modulation code having a long bit length is divided into a plurality of blocks and processed. Therefore, the circuit scale for decoding the components of each respective block may be small, and a reduction in size of the circuit scale as a whole can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1A is an explanatory view showing the content of an eight-to-fifteen conversion table A;

FIG. 1B is a view showing the continued content of FIG. 1A;

FIG. 1C is a view showing the continued content of FIG. 1B;

FIG. 1D is a view showing the continued content of FIG. 1C;

FIG. 1E is a view showing the continued content of FIG. 1D;

FIG. 2A is an explanatory view showing the content of an eight-to-fifteen conversion table B;

FIG. 2B is a view showing the continued content of FIG. 2A;

FIG. 3A is an explanatory view showing the content of an eight-to-fifteen conversion table C;

FIG. 3B is a view showing the continued content of FIG. 3A;

FIG. 4 is an explanatory view showing the content of an eight-to-fifteen conversion table D;

FIG. 5 is an explanatory view showing the content of an eight-to-fifteen conversion table E;

FIG. 6A is an explanatory view showing the content of an eight-to-fifteen conversion table F;

FIG. 6B is a view showing the continued content of FIG. 6A;

FIG. 6C is a view showing the continued content of FIG. 6B;

FIG. 8 is a view showing a decoder according to one embodiment of the present invention;

FIG. 11A is an explanatory view shown to explain the process of converting the code converted by the eight-to-fifteen modulation conversion table F into the same content as the code converted by tables A and B by an exclusive logic processor;

FIG. 11B is an explanatory view shown to explain the continuation of FIG. 11A and the process of converting the code converted by the eight-to-fifteen modulation conversion table F into the same content as the code converted by tables A and B by an exclusive logic processor and a shift processor;

FIG. 12 is a view showing the logic conversion table of a six-to-four decoder;

FIG. 14 is a view showing the logic conversion table of an eleven-to-eight decoder.

DETAILED DESCRIPTION OF THE PREFERRED EMBODIMENTS

Figure 7:
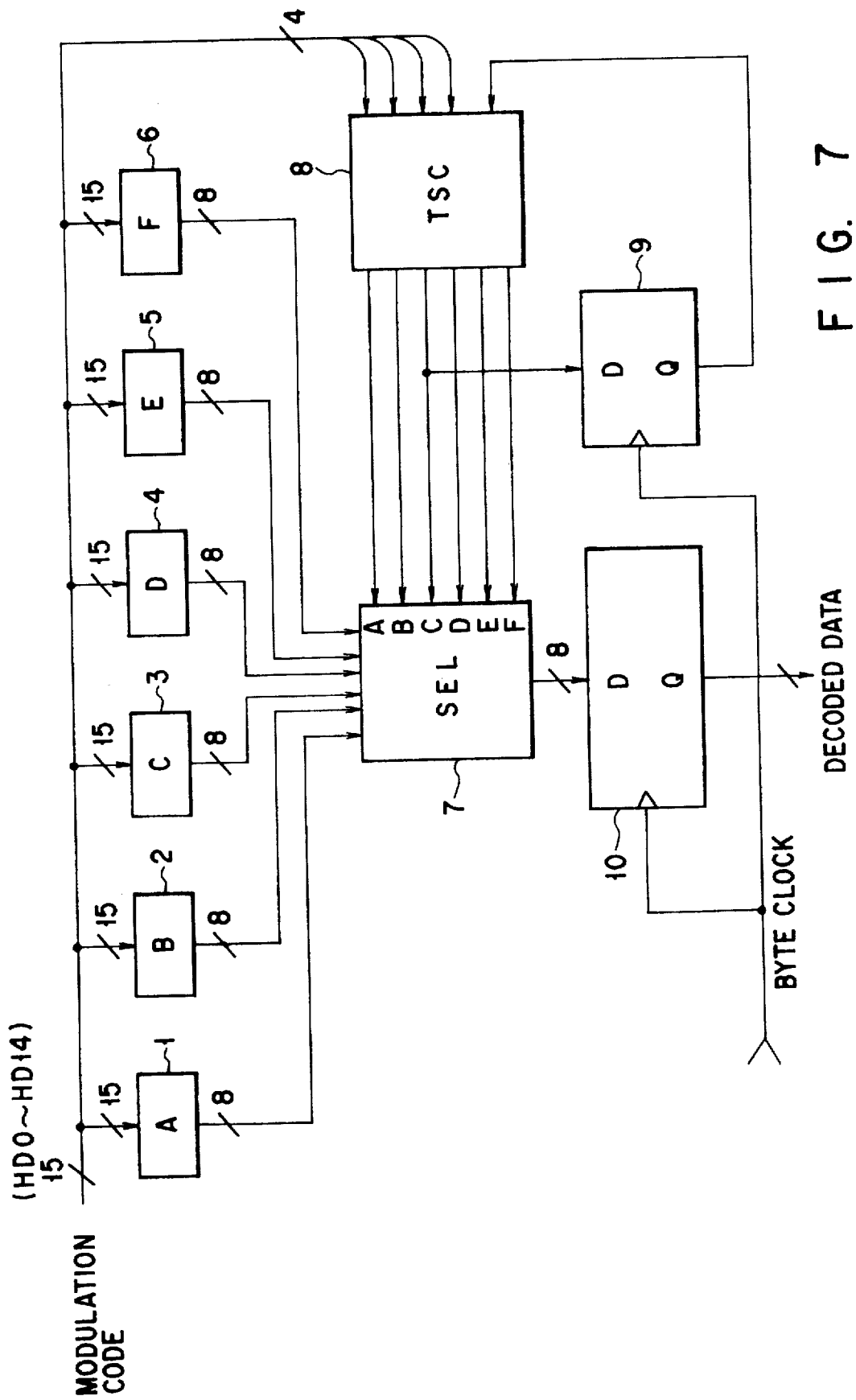
FIG. 7 is a view showing an example of a fifteen-to-eight decoder.

Hereinafter, embodiments of the present invention will be explained in detail with reference to accompanying drawings.

Figures 1D, 1E:
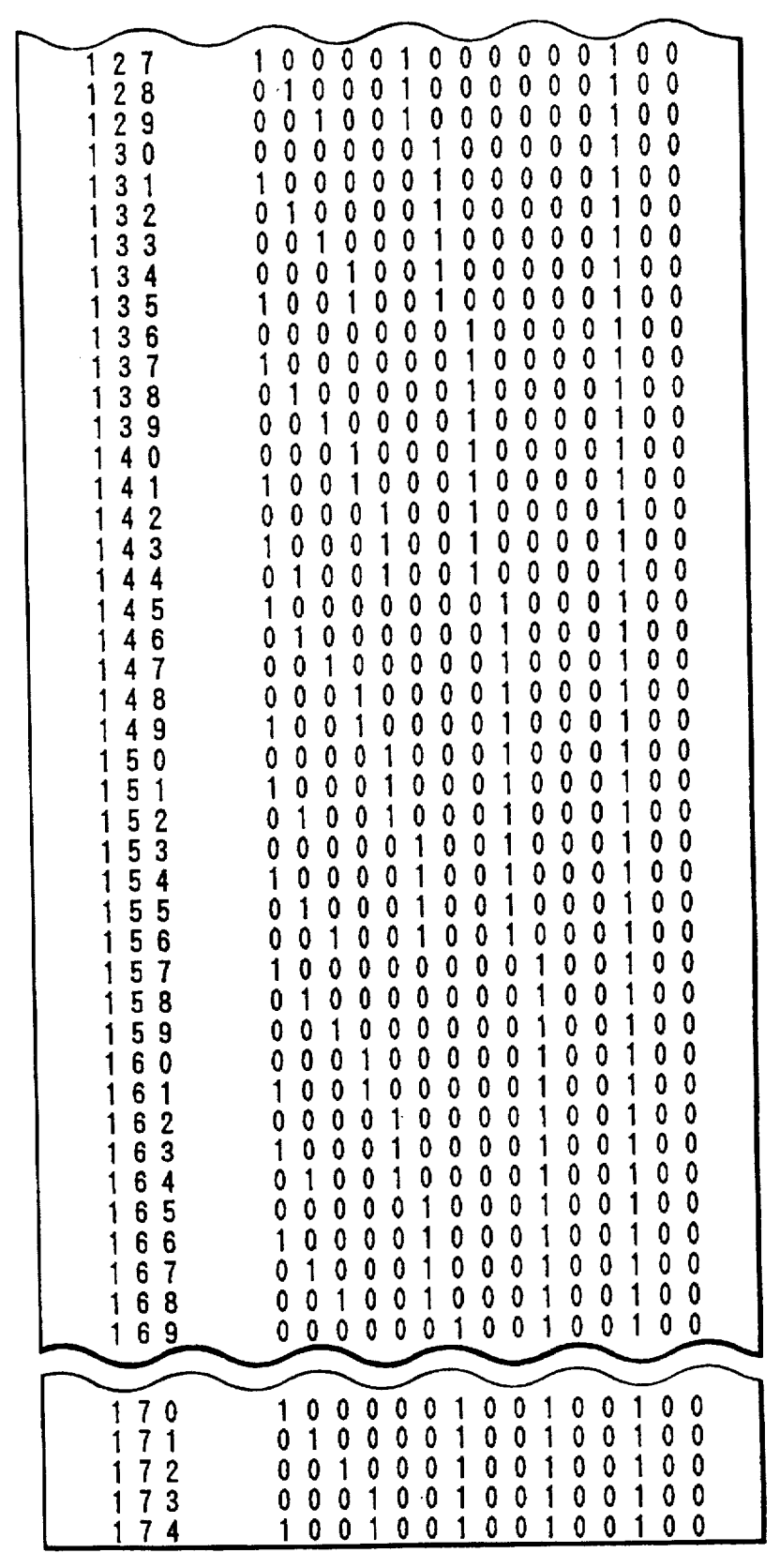

First, the technology of the premise of the present invention will be explained with reference to FIGS. 1 to 7.

To increase the recording density of a disk by means of improved modulation techniques related to signal processing, techniques for (2, 7) PLL modulation or an EFM modulation side are proposed.

This is an eight-to-fifteen modulation for converting, for example, an 8-bit digital code into a 15-bit code according to a specific rule. Since at least two bits "0" exist between a bit "1" and the next bit "1" in a modulation code row, the minimum inversion interval Tmin of the data after non-return-to-zero NRZI is (3×(8/15))T=1.6T (where T is data period before the modulation); a detecting window width Tw is (8/15)T (approximately equal to 0.53T), and hence an improvement in the recording density is expected.

An example of the translation rule of the above described eight-to-fifteen modulation will be explained.

Six types of tables A to F for converting the 8-bit source code into the 15-bit modulation code are prepared.

The respective tables will be explained.

There are 189 types of the 15-bit codes in which the two bits of the rightmost side becomes ". . . 00".

Table A is produced by preparing 175 types, except for the following 14 types, from the above-mentioned 189 types. Table A is used to convert the 8-bit source code of 9 to 174 (represented as a decimal).

00000 00000 00000
10000 00000 00000
01000 00000 00000
00100 00000 00000
00000 10000 00000
00000 00100 00000
00000 00010 00000
00000 00010 01000
00000 00010 00100
00000 00001 00000
00000 00001 00100
00000 00000 10000
00000 00000 01000
00000 00000 00100

The entire codes of table A are shown in FIGS. 1A to 1E.

When the output codes of table A are observed, the following can be stated. The maximum run in the code contains eleven bits "0" as seen in "10000 00000 00101". The rightmost run contains two bits "0" at the minimum and eleven bits "0" at the maximum, and the leftmost run contains zero bits "0" at the minimum and seven bits "0" at the maximum. The 59 types of the codes are started from the code of "1".

There are 88 types of the 15-bit codes in which the four bits of the rightmost end become ". . . 0010".

Table B is produced by preparing the 81 types, except for the following seven types, from the above-mentioned 88 types. Table B is used to convert the 8-bit source codes of 175 to 255.

00000 00000 00010
10000 00000 00010
00000 00100 00010
00000 00100 10010
00000 00001 00010
00000 00001 00010
00000 00000 00010

The entire codes of the table B are shown in FIGS. 2A and 2B.

When the output codes of the table B are observed, the following can be stated. The maximum run in the code contains eleven bits "0" as observed in "01000 00000 00010". The rightmost run is one "0", and the leftmost run contains zero bits "0" at the minimum and six bits "0" at the maximum. There are 27 types of the codes in which the leading number is "1".

There are 129 types of the 15-bit codes in which the rightmost three bits become ". . . 001".

Tables C, D and E are produced by preparing 115 types by removing the following 14 types from the above-mentioned 129 types.

00000 00000 00001
00000 00001 00001
00000 00010 00001
00000 00100 00001
10000 00000 00001
00000 00000 01001
00000 00010 01001
00000 00100 01001
00000 10010 01001
00100 10000 01001
01001 00000 01001
10010 00000 01001
00000 00000 10001
00000 00100 10001

When the 115 types of the 15-bit codes are observed, the following can be stated.

The maximum run in the code contains twelve bits "0" as observed in "01000 00000 00001". The rightmost run is zero bits, and the leftmost run contains zero bits "0" at the minimum and six bits "0" at the maximum.

Tables C, D and E are set as follows by using the codes therein.

Table C contains 81 types of the above-mentioned 115 types in which the rightmost end is ". . . 0001", and coincides at the leftmost run with table B. Table C is used to convert the source codes of 175 to 255, and its conversion outputs all become "0001" at the rightmost four bits. The entire codes of table C are shown in FIGS. 3A and 3B.

Table D contains 34 types of the above-mentioned 115 types in which the rightmost end is ". . . 001001", and coincides at the leftmost run with table A. Table D is used to convert the source codes of 0 to 33 so that all the rightmost end six bits become "0" when converted by table A. The rightmost end four bits of the converted outputs all become "1001". The entire codes of table D are shown in FIG. 4.

Table E contains the codes shown in FIG. 5 arbitrarily selected from the 115 types in which the leftmost run is two or more. Table E selects the source codes so that all the rightmost end six bits become "0" when the 86 types of the source codes to be converted in table F (to be explained later (FIGS. 6A to 6C)) are converted by table F. The converted outputs of table E (used to convert the selected source codes) contain 17 types of codes in which all the rightmost end three bits become "001" and the leftmost end two bits become "00".

The table F contains 86 types in which the following two types are removed from the 88 types of the 15-bit codes of "00 . . . 00" (FIGS. 6A to 6C).

00000 00000 00000
00100 00000 00000

The maximum run in the code contains nine bits "0" as observed in "00100 00000 00100". The rightmost run contains two bits "0" at the minimum and eleven bits "0" at the maximum, and the leftmost run continues two bits "0" at the minimum and twelve bits "0" at the maximum. Table F is obtained by selecting the source codes in which the leftmost end one bit becomes "1" when the source codes of 0 to 255 are converted by table A or B. The converted outputs of table F used to convert the selected source codes contain 86 types in which all the rightmost end two bits are "00" and the leftmost end two bits are "00".

When the types and the features of the contents of the 15-bit codes of tables A to F described above are summarized, the following is obtained:

1. Table A contains 175 types (tail code: . . . 00)
2. Table B contains 81 types (tail code: . . . 0010)
3. Table C contains 81 types (tail code: . . . 0001)
4. Table D contains 34 types (tail code: . . . 001001)
5. Table E contains 17 types (leading code:00 . . . tail code: . . . 001)
6. Table F contains 86 types (leading code:00 . . . tail code: . . . 00)

The total sum of the types of the codes are 474. When the relationships between the above tables are summarized, the following is obtained:

1. All the codes of table B do not exist in the other tables.
2. None of the codes in tables C and D are duplicates of each other.
3. The leftmost run of table C coincides with the leftmost run of table B.
4. The leftmost run of table D coincides with the leftmost run of table A.
5. Almost all the codes of table F exist in table A.
6. All the codes of table E exist in tables C and D.

In the foregoing description, only the contents of the converted codes corresponding to the source codes are designated. Next, a method of designing how to allocate the source codes to the respective tables will be explained.

(1) Source codes 0 to 174 (175 types)

The source codes are allocated to table A. The 34 types of the source codes in which the rightmost end run becomes 6 or more in table A are also allocated to table D for the case where the run at the time of connecting to the next code becomes 13 or more. The 59 types of the source codes in which the leading bit becomes "1" in table A are also allocated to the 59 types of the source codes in which the rightmost end run becomes 6 and are also allocated to table E for the case that the run becomes 13 or more at the time of connecting to the next code.

(2) Source codes 175 to 255 (81 types)

The source codes are allocated to both tables B and C. The 27 types of the source codes in which the leading bit becomes "1" in table B are also allocated to the 27 types of the 86 types of table F.

Then, when the tables are produced based on the above-mentioned designing conditions, the converting conditions of the input source codes (table using conditions) become the following algorithm.

(1) For source codes 9 to 174

Complete one-byte conversion is conducted, including the case where the conversion table of the present source codes is determined according to the next source code.

Specifically, when 141 types of the source codes except the 34 types allocated to table D are input, the source codes are converted by table A independently of the next source codes. When the 34 types of the source codes also allocated to table D are input, in the case that the connecting results of the 15-bit codes converted by table A and the 15-bit codes converted by tables A or B from the continuous second byte become 13 or more, the source codes are converted by table D instead of table A. If not, the source codes are converted by table A.

Specifically, the source codes of 0 to 174 are fundamentally converted by table A. However, for the source codes in which 13 or more bits "0" are contained in the connecting result in the case where the next source codes are converted by tables A or B (which might occur in the 34 types of the source codes of 0 to 33), the source codes are converted by table D.

(2) For source codes 175 to 255

Any of the 170 types of the source codes in which the leading bit becomes "0" when the next source codes are converted by tables A or B is completely one byte converted by table B for the present source codes.

When the source code of the second byte is converted by tables A or B, any of the 86 types in which the leading bit becomes "1" is perfectly two byte-complete-converted according to the following sequence. First, initial source codes 117 to 255 are converted not by table B but by table D and determined. The second byte source code of any of the 86 types of the source codes is converted as follows. The second byte source code of the 69 types (except the 17 types allocated also to table E) is converted by table F. However, the second byte source code of the 17 types allocated also to table E is converted by table E instead of table F when the connecting result of the 15-bit code converted by table F and the 15-bit code converted by table B becomes run 13 or more, and if not, it is converted by table F to complete the second byte.

Specifically, the source codes of 177 to 255 are fundamentally converted by table B, but when the source code continued to next is converted by the tables A or B, in the case of the source codes of the 86 types in which the leftmost end bit becomes "1", it is converted by table C. At this time, the next second source code is converted by tables E or F. Specifically, when the conversion using table C is conducted, the conversion using tables E or F is always executed next.

Whether or not the source code is converted by tables F or E is determined according to the content of the third source code further continued. The source code is fundamentally converted by table F, but 13 or more bits "0" are continued at the connecting result when the third source code is converted by tables A or B (which might occur in the source codes of the 17 types of table F), and is converted by table E.

The algorithm of the case that the 15-bit codes code-modulated by using tables A to F as described above is decoded to the source code will be explained.

The decoding is handled as the 1-byte or 2-byte complete conversion.

The input 15-bit codes are decoded according to any of the tables A, B, C and D. Since the codes are not duplicated from each other, the codes are unitarily correctly decoded.

Of course, when the present 15-bit codes are decoded by using table C, the next input 15-bit code is decoded according to tables E or F.

As described above, the modulation from the 8-bit code to 15-bit code and simultaneous decoding from the 15-bit code to the 8-bit source code can be executed. Specifically, when m-bit source code is converted to n-bit conversion code, it can be easily converted directly to (>m)-bit conversion code without using a complicated procedure like the conventional procedure that it is first converted to smaller q-bit intermediate code then n-bits and (n–q) bits are added thereto, and its reverse conversion can be directly executed.

The modulation needs to be monitored for the source code in the 3 byte width as the maximum, but the modulation result is completed in the two byte width. The demodulation is simple. The steps of referring to the conversion table at each one modulation code to demodulate it to one byte and simultaneously determining the conversion table used for demodulating the next modulation code are merely repeated. The conversion tables between the 8-bit and 15-bit codes include 6 types, total number of 474 (the details of which fundamentally include 2 types of tables, 256 and 4 types of substitutes, 218).

In the converting operation, the data contents of only the connector of 15 bits+15 bits are not always altered, but the entirety is altered of the complete type in which the leading bit of the 15 bits continued to next is not altered, and all the conversions are conducted according to the respective separate tables based on the divided simple cases. Specifically, the conversion of the different source code 8 bits to the 15 bits of the same conversion code between the different tables is recognized by preparing the separate tables divided into the cases according to the continuous state of the source codes, and hence the conversion codes of less number are particularly devised.

The decoding algorithm for reversely converting the digital data code-converted as described above to the original code will be simply explained.

The 15-bit modulation codes represented at first are converted by any of tables A, B, C and D, and since the codes are not duplicated, the discrimination between tables A, B, C or D is facilitated by the rightmost end 2–4 bits. The codes are converted by reverse tables based on the discriminated result to be decoded. If the input data is judged to be converted by table C, the next modulation code is always converted by tables F or E, and hence the modulation code continued to next is converted by any of the reverse tables of tables F or E.

FIG. 7 shows the configuration of a decoding apparatus for decoding eight-to-fifteen modulation code.

Table reverse converters 1 to 6 from table A to table F are connected to 15-bit input data line, and the outputs are sent to a selector 7. A table selector 8 determines which of table reverse converters 1 to 6 is selected according to the rightmost end 4 bits of the input data and the decoding selected result from the previous time (the output of a latched circuit 9).

The decoding algorithm and the configuration itself of the decoding apparatus itself described above are simple, but when it is intended to be actually integrated, it has a problem in the scale.

Since the contents of the tables are complicated, there is a method of using a ROM, a method of designing a converter with a logical synthesis driven by a computer, but since the types of the tables are many, its efficiency is low, and it results in a gate scale up to several kilo gates to occupy considerable chip area.

In the case of a single IC of a decoding circuit, it is facilitated, but when an integration accompanied with other signal processors is considered, an increase in a chip size and hence an increase in its cost occurs, and even if the high density is provided, its effect is reduced by half.

Therefore, the present invention contemplates an apparatus for decoding data and a method of decoding data in which a modulation code used for its high density of disk recording is easily recoverable from a decoding processor according to the above-described modulation techniques and a recording medium.

Specifically, the present invention fundamentally comprises exclusive logic means for converting an arbitrary bit to "1" or "0" in response to a specific bit pattern generated in m-bit code, bit shift means for shifting the partial or entire bit position of the m-bit code by a predetermined quantity in a rightward or leftward direction, a plurality of numeric value converting means for dividing the m-bit code into a plurality of blocks (dividing by m at the maximum) and converting it to a predetermined numeric code in response to the bit position for generating "1" (in the case of positive logic) in the respective blocks, and numeral data processing means for adding or subtracting the numeric code obtained by said numeric value converging means.

The features of the present invention will be explained with reference to the accompanied drawings.

FIG. 8 is an embodiment of the present invention.

A 15-bit (HD0 to HD14 sequentially from a right side bit) modulation code introduced to an input unit IN is supplied to an exclusive logic processor 11. The 15-bit data processed by the exclusive logic processor 11 is input to and processed by a shift processor 12. The data (SD0 to SD13) output from the shift processor 12 are distributed to a six-to-four decoder 13 and an eleven-to-eight decoder 14. The 8-bit outputs of the six-to-four decoder 13 and the eleven-to-eight decoder 14 are input to an 8-bit adder 15. The output of the 8-bit adder 15 is input to and latched by a latched circuit 10, and output to an output unit OUT as decoded data.

The 15-bit modulation code of the input unit IN is also input to a pattern control circuit 16. The pattern control circuit 16 discriminates which table the 15-bit modulation code is converted by. When the 15-bit modulation code is converted by tables A or B, the exclusive logic processor 11 and the shift processor 12 are so controlled as to output the 15-bit modulation code as it is. The reason why the bit signal of HD14 is not output from the shift processor 12 as the SD14 is because it is an invalid bit which is zeroed in both tables A and B.

When the input modulation codes (HD0 to HD14) are modulated by tables C or D, the exclusive logic processor 11 is validated. When the input modulation codes are modulated by tables E or F, either the exclusive logic processor 11 or the shift processor 12 is validated in response to the content of the bits of the HD2. Thus, the modulation code modulated by tables C, D, E or F is replaced with the modulation code modulated by basic tables A or B.

When the modulation of the input modulation codes by tables E or F is determined, it is determined according to the output of the latched circuit 9 for latching whether or not the modulation code input for decoding the previous time is modulated by table C.

Figure 9:
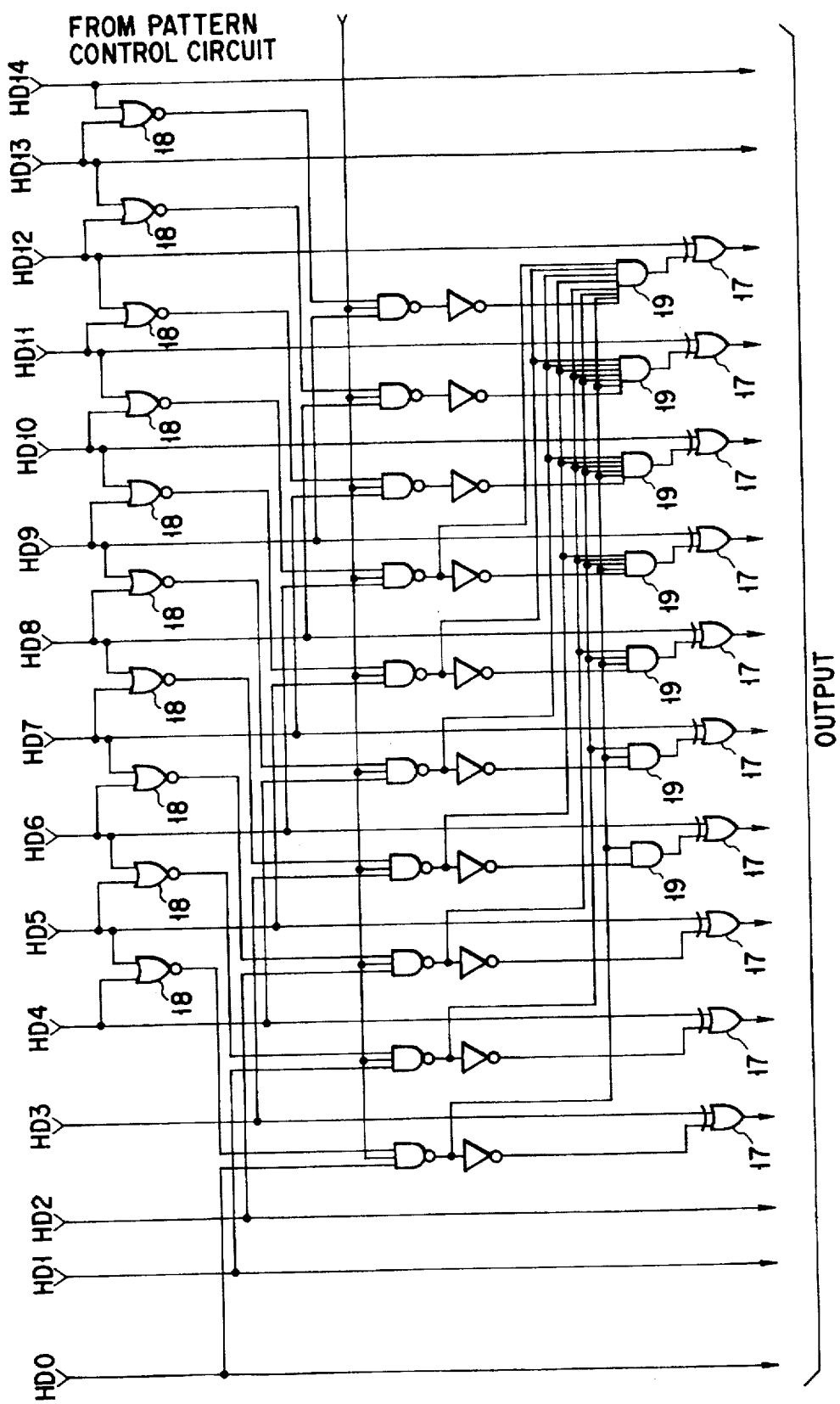
FIG. 9 is a view showing a detailed exclusive OR processor of FIG. 8.

FIG. 9 shows the detailed configuration example of the above-described exclusive logic processor 11.

The exclusive logic processor 11 detects the bit in which "1" of the input modulation code is set up, converts the bit "1" to "0" if the rightward third bit from the bit is "1", or converts the bit to "1" if the rightward third bit is "0". The final bit of the conversion is fundamentally obtained by an exclusive OR circuit 17 group. However, when the bit is converted from "0" to "1", whether or not the right adjacent second bit from the bit is "0" is detected by an OR circuit 18 group, it is converted in the case of "0", and limited to only the case that the converted result does not deviate from the translation rule. In the conversion process, an AND circuit 19 group for preferentially outputting to the leftward side is provided, and only one bit is to be its object within one code.

For instance, when the input modulation code is the next code determined to be converted by the table F, the source code before the modulation is 40 by decimal number.

The number of the input bits is 14. The fundamental concept is the conversion of six bits to four bits. The translation rule is defined to sum the converted value (decimal converted values 1, 2, 3, 4, 6, 9 shown in FIG. 12) of the bit in which "1" is set up in the SD0 to SD13 to be input and convert it to binary number. For instance, in the case of "010001", "1" is set up in the SD1 and the SD5.

| HD | 0 | 1 | 2 | 3 | 4 | 5 | 6 | 7 | 8 | 9 | 10 | 11 | 12 | 13 | 14 |
|----|---|---|---|---|---|---|---|---|---|---|----|----|----|----|----|
|    | 0 | 0 | 0 | 0 | 1 | 0 | 0 | 0 | 1 | 0 | 0  | 1  | 0  | 0  | 0  |

Figure 13:
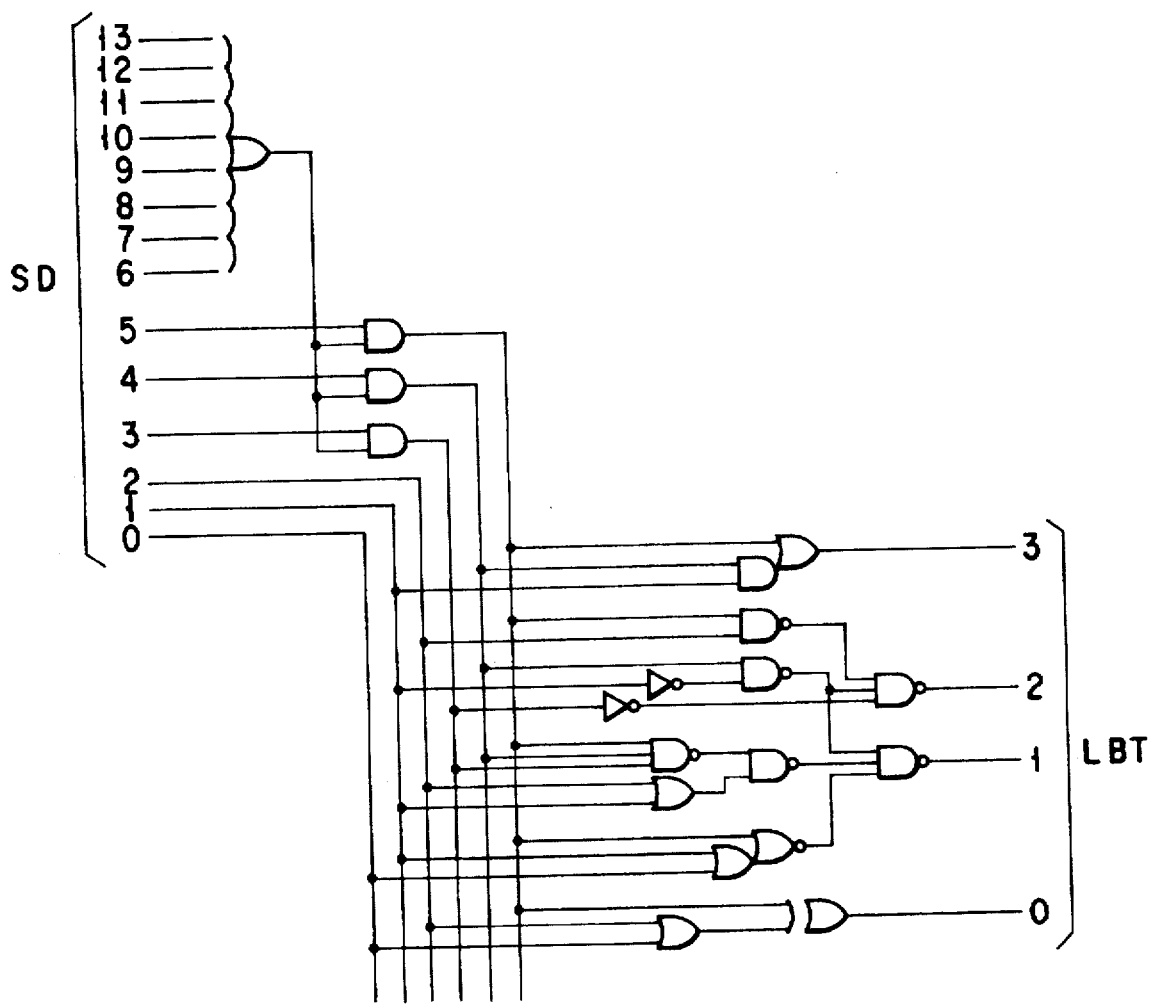
FIG. 13 is a view showing the detailed circuit of the six-to-four decoder.

When this is observed from the leftward direction, "1" is first set up in the HD4. In this case, it tends to convert the bit of the HD7 to "1", but since the logic OR result of the HD8 and the HD9 is not "0", it cannot be converted. Then, "1" is set up in the HD8. This time, the bit of the HD11 is to be its object, but since its original is "1", it is converted to "0" despite the values of the HD12 and the HD13. The converted results are as follows When the converted value 2 and the converted value 9 are summed, the total sum becomes 11. When it is converted to a binary number, "1011" is obtained. This is used as the decoded output. The example of the circuit for realizing this process is shown in FIG. 13, which contains OR circuits, AND circuits, inverters, NAND circuits, etc. This circuit is merely illustration only, and various embodiments can be provided based on the above-mentioned theory.

| HD | 0 | 1 | 2 | 3 | 4 | 5 | 6 | 7 | 8 | 9 | 10 | 11 | 12 | 13 | 14 |
|----|---|---|---|---|---|---|---|---|---|---|----|----|----|----|----|
|    | 0 | 0 | 0 | 0 | 1 | 0 | 0 | 0 | 1 | 0 | 0  | 0  | 0  | 0  | 0  |

When the bit of the HD0 is forcibly set to "1", its content coincides with the source code 40 of the table A. Thus, the bit processing is executed in the exclusive logic processor 11 under predetermined conditions. Then the result is returned to the source codes of tables A and B, and prepared for the following decoding process.

Figure 10:
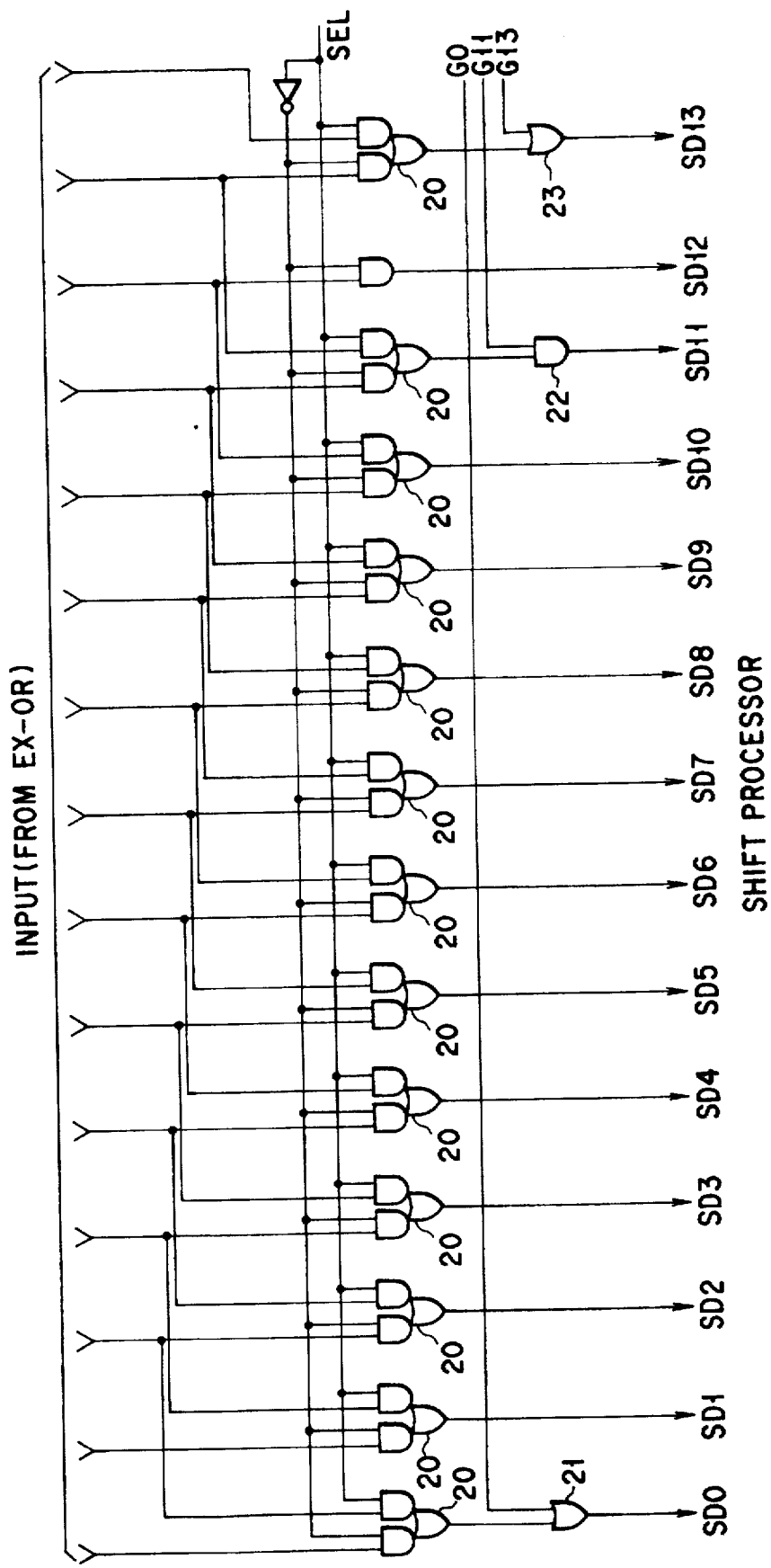
FIG. 10 is a view showing a detailed shift processor of FIG. 8.

FIG. 10 is the detailed configuration of the shift processor 12.

The shift processor 12 is fundamentally a mere 2-input selector 20 group. The signal is switched from the bit position of right adjacent second bit from the normal bit position to the bit position of the right adjacent second bit. Gate circuits 21 and 22 are provided at the route of the SD0, the SD11 and the SD13 forcibly convert the bit to "1" or "0" according to gate signals G0, G11, G13.

FIGS. 11A and 11B show the process of converting the eight-to-fifteen-modulated conversion table F to the conversion code of the same content as that converted by tables A or B by the exclusive logic processor 11 and the shift processor 12 as an example.

The codes of the range of the source codes 1 to 174 are conducted for exclusive logic processing, and the codes of the range of the source codes 178 to 254 are executed for shift processing. "1001" is converted to "1000" and "1000" is converted to "1001" as indicated by an underline in the codes of FIGS. 11A and 11B. Then, the bits indicated by "*" are forcibly converted to "1", and hence converted to the codes of the same content as that of the code converted by tables A or B.

With respect to the other tables C, D and E, the same operation is executed, and fundamentally the same except that the bit positions to be forcibly converted to "1" or "0" are slightly different.

The six-to-four decoder 13 and the eleven-to-eight decoder 14 will be explained.

FIG. 12 shows the logic conversion table of the six-to-four decoder 13 and FIG. 13 shows the detailed circuit example of the six-to-four decoder.

FIG. 14 shows the logic conversion table of the eleven-to-eight decoder 14. This decoder 14 is provided by the same way of concept as the six-to-four decoder 13. The decoder 14 sums the converted values of the bits in which "1" is set up in the input SD. However, the converted values of "1" are set up at the rightmost end, and all the bits except it are different in their converted values.

For instance, in the case of "10010010", "1" is set up in the SD6 and the SD9 and further the SD12. The "1" disposed at the rightmost end of the bit row is at the position of the SD12, and when the table under this row is observed, 117 is described.

The "1" of the SD6 is the converted value 13 when the table under it is observed. The "1" of the SD9 is the converted value 39 (since the SD13 is "0") when the table under it is observed. Then, when the 117, the 13 and the 38 are summed, the total sum becomes 169. When the 169 is converted to corresponding binary number by searching it in the column of the decimal display, it becomes "10101001" (169 by decimal). This is used as the decoded output.

The decoded output LBT (LBT4 to LBT7 are fixed to "0000") obtained as described above and the HBT are input to the 8-bit adder 15 to be added. Thus, the original source code is restored.

The present invention is not only applicable to the decoding of the above-described eight-to-fifteen modulation code, but also applied to various applications. The method of dividing the modulation code to be varied at its numeric value and adding them can be applied to various tables. For instance, it is not indispensable that the source code starting in table A be "0 0 0 1 0 0 0 0 0 0 0 0 0 0" or that the conversion bit width be 15 bits, the source code starting in the 14-bit conversion table may be "1 0 0 0 0 1 0 0 0 0 0 0 0 0" as indicated next.

| Source code | HD 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 0  | 0 | 0 | 0 | 0 | 0 | 1 | 0 | 0 | 0 | 0 | 0 | 0 | 0 | 0 | 0 |
| 1  | 1 | 0 | 0 | 0 | 0 | 1 | 0 | 0 | 0 | 0 | 0 | 0 | 0 | 0 | 0 |
| 2  | 0 | 1 | 0 | 0 | 0 | 1 | 0 | 0 | 0 | 0 | 0 | 0 | 0 | 0 | 0 |
| 3  | 0 | 0 | 1 | 0 | 0 | 1 | 0 | 0 | 0 | 0 | 0 | 0 | 0 | 0 | 0 |
| 4  | 0 | 0 | 0 | 0 | 0 | 0 | 1 | 0 | 0 | 0 | 0 | 0 | 0 | 0 | 0 |
| 5  | 1 | 0 | 0 | 0 | 0 | 0 | 1 | 0 | 0 | 0 | 0 | 0 | 0 | 0 | 0 |
| 6  | 0 | 1 | 0 | 0 | 0 | 0 | 1 | 0 | 0 | 0 | 0 | 0 | 0 | 0 | 0 |
| 7  | 0 | 0 | 1 | 0 | 0 | 0 | 1 | 0 | 0 | 0 | 0 | 0 | 0 | 0 | 0 |
| 8  | 0 | 0 | 0 | 0 | 0 | 0 | 0 | 1 | 0 | 0 | 0 | 0 | 0 | 0 | 0 |
| 9  | 1 | 0 | 0 | 0 | 0 | 0 | 0 | 1 | 0 | 0 | 0 | 0 | 0 | 0 | 0 |
| 10 | 0 | 0 | 0 | 0 | 0 | 0 | 0 | 1 | 0 | 0 | 0 | 0 | 0 | 0 | 0 |
| 11 | 1 | 0 | 0 | 0 | 0 | 0 | 0 | 1 | 0 | 0 | 0 | 0 | 0 | 0 | 0 |
| :  | : | | | | | | | | | | | | | | |
| 19 | 0 | 0 | 0 | 0 | 0 | 0 | 0 | 0 | 1 | 0 | 0 | 0 | 0 | 0 | 0 |
| 20 | 1 | 0 | 0 | 0 | 0 | 0 | 0 | 0 | 1 | 0 | 0 | 0 | 0 | 0 | 0 |
| :  | : | | | | | | | | | | | | | | |

In this case, there is a six-to-eight numeric value conversion decoder for dividing HD0 to DH5 and HD6 to HD13, so determined that the converted value of the bit position of the HD0 is set to "1", the converted value of the bit position of the DH1 is set to "2", the converted value of the bit position of the HD2 is set to "3", and the converted value of the bit value of the HD3 is set to "4". There is also an eight-to-eight numeric value conversion decoder, so determined that the converted value of the bit position of the HD6 is set to "4", and the converted value of the bit position of the HD7 is set to "10".

In summary, there is provided the code group in which the position where "1" is set up is varied along with the rule of setting up "1" from the leftward or rightward direction and forcing it, while satisfying the conditions that determined the number of bits "0" between successive bits "1", to match the increase of the source code represented by the decimal number from the output conversion code as described above. Of course, there is no problem even if slight omission occurs on the way of the table. For example, the following table of

| : | | | | | | | | | | | | | |
|---|---|---|---|---|---|---|---|---|---|---|---|---|---|
| n−1 | 0 | 1 | 0 | 0 | 0 | 1 | 0 | 0 | 1 | 0 | 0 | 1 | 0 | 0 |
| n   | 0 | 0 | 1 | 0 | 0 | 1 | 0 | 0 | 1 | 0 | 0 | 1 | 0 | 0 |
| n+1 | 0 | 0 | 0 | 0 | 0 | 0 | 0 | 0 | 1 | 0 | 0 | 0 | 1 | 0 |
| n+2 | 1 | 0 | 0 | 0 | 0 | 0 | 0 | 0 | 1 | 0 | 0 | 0 | 1 | 0 | may be produced as follows:

| : | | | | | | | | | | | | | |
|---|---|---|---|---|---|---|---|---|---|---|---|---|---|
| n−1 | 0 | 1 | 0 | 0 | 0 | 1 | 0 | 0 | 1 | 0 | 0 | 1 | 0 | 0 |
| n   | 0 | 0 | 1 | 0 | 0 | 1 | 0 | 0 | 1 | 0 | 0 | 1 | 0 | 0 |
| n+1 | 1 | 0 | 0 | 0 | 0 | 0 | 0 | 0 | 0 | 0 | 0 | 0 | 1 | 0 |
| n+2 | 0 | 1 | 0 | 0 | 0 | 0 | 0 | 0 | 0 | 0 | 0 | 0 | 1 | 0 |

Accordingly, the present invention may be applied to the case that the minimum number of bits "0" existing between successive bits "1" is 3 or 4 or more. How the converted value to the decimal number to be used in the decoder is set and the fundamental concept is the same.

In the embodiment described above, the modulation code is divided into the two blocks. However, according to the present invention, the modulation code may be divided into three or four blocks. In this case, the numeric value conversion tables are simplified, but the hardware required for addition is, by contrast, increased. As a result, it is preferable to set the number of divisions by considering the entire computational balance.

According to the present invention as described above, the code reverse conversion (decoding) can be realized by a sufficiently small scale circuit even without using elements such as ROM, etc., and is remarkably effective to integrate the configuration. Thus, the chip size of the IC itself is suppressed, and the high density of the optical disk can be realized without increasing the cost.

Additional advantages and modifications will readily occur to those skilled in the art. Therefore, the invention in its broader aspects is not limited to the specific details, representative devices, and illustrated examples shown and described herein. Accordingly, various modifications can be made without departing from the spirit or scope of the general inventive concept as defined by the appended claims and their equivalents.

What is claimed is:

1. A decoding apparatus for converting an m-bit conversion code into an n-bit source code, comprising:

pre-processing means for fetching the m-bit conversion code, for generating a pre-processed m-bit conversion code using a plurality of conversion tables and for extracting from the pre-processed m-bit conversion code a first data block and a second data block;

first means for decoding the first data block to obtain a first decode output;

second means for decoding the second data block to obtain a second decode output; and means for adding the first decode output and the second decode output to obtain the n-bit source code.

2. A decoding apparatus for converting an m-bit conversion code into an n-bit source code according to claim 1, wherein a present m-bit conversion code and a previous m-bit conversion code satisfy the following rules:

(i) at least two bits "0" are successively interposed between a bit "1" and a subsequent bit "1" throughout the present m-bit conversion code;

(ii) at least two bits "0" are successively interposed between a rightmost bit "1" of the previous m-bit conversion code and a leftmost bit "1" of the present m-bit conversion code; and (iii) the maximum number of bits "0" successively located in the present m-bit conversion code is limited to a predetermined number; and wherein the pre-processing means includes:

(i) table identifying means for identifying the conversion tables which are used for conversion of the present m-bit conversion code on the basis of the previous m-bit conversion code, the leftmost end bits of the present m-bit conversion code and the rightmost end bits of the present m-bit conversion code;

(ii) arithmetic means for processing the present m-bit conversion code on the basis of an identification result of the table identifying means, thereby to obtain the preprocessed m-bit conversion code;

(iii) means for dividing the pre-processed m-bit conversion code into the first data block and the second data block; and (iv) means for supplying the first and second data blocks to the first and second decoding means.

3. A decoding apparatus according to claim 2, wherein a first m-bit conversion code, generated from the n-bit source code by means of a first conversion table, and a second m-bit conversion code, generated from the n-bit source code by means of a second conversion table different from the first conversion table, contain bits that differ from one another in corresponding bit locations.

4. A decoding apparatus according to claim 3, wherein (i) when the table identifying means identifies one of the conversion tables to be used for conversion of the present m-bit conversion code, as a first conversion table, the arithmetic processing means outputs the present m-bit conversion code as the preprocessed m-bit conversion code; and (ii) when the table identifying means identifies one of the conversion tables to be used for conversion of the present m-bit conversion code, as a second conversion table, the arithmetic processing means inverses or shifts predetermined bits of the present m-bit conversion code to provide an m-bit intermediate conversion code and then outputs the intermediate m-bit conversion code as the pre-processed m-bit conversion code.

5. A decoding apparatus according to claim 4, wherein the bits of the intermediate m-bit conversion code are identical to bits of a reference m-bit conversion code into which a reference n-bit source code has been converted according to the first conversion table.

6. A decoding apparatus according to claim 2, wherein the present m-bit conversion code is included in a signal reproduced from an optical disk.

7. A decoding apparatus according to claim 2, wherein:

the conversion codes for use in converting a given n-bit source code into a resulting m-bit conversion code, wherein m>n, are stored in conversion tables A, B, C, D, E and F of the plurality of conversion tables;

values expressed by n bits are "0" to "N";

each of n-bit source codes which respectively correspond to "0" to "N/2" is a first source code;

each of n-bit source codes which respectively correspond to "{(N+1)/2}" to "N" is a second source code;

the first source code is converted according to the conversion table A; an n-bit source code is converted according to the conversion table B when the n-bit source code has rightmost end bits including at least six "0" bits successively located;

an n-bit source code is converted according to the conversion table F when a lead bit of the n-bit source code is "1";

an n-bit source code is converted according to the conversion table E when a lead bit of the n-bit source code is "1" and right most end bits of the n-bit source code include at least six "0" bits successively located; and wherein the conversion codes stored in the conversion tables A, B, C, D, E and F satisfy the following conditions:

(i) rightmost end two bits of each of the conversion codes stored in the conversion table A are "00";

(ii) rightmost end four bits of each of the conversion codes stored in the conversion table B are "0010";

(iii) rightmost end four bits of each of the conversion codes stored in the conversion table C are "0001";

(iv) rightmost end six bits of each of the conversion codes stored in the conversion table D are "001001";

(v) rightmost end three bits of each of the conversion codes stored in the conversion table E are "001";

(vi) rightmost end two bits of each of the conversion codes stored in the conversion table F are "00";

(vii) at least two bits "0" are successively interposed between bit "1" and bit "1" throughout each of the conversion codes;

(viii) the maximum number of bits "0" successively located in each of the conversion codes stored in the conversion table B is eleven;

(ix) the maximum number of bits "0" successively located in each of the conversion codes stored in the conversion table A is eleven;

(x) the maximum number of bits "0" successively located in each of the conversion codes stored in the conversion tables C, D and E is twelve;

(xi) the maximum number of bits "0" successively located in the conversion codes stored in the conversion table F is nine;

(xii) the conversion codes stored in the conversion table B are not stored in any of the conversion tables A, C, D, E and F;

(xiii) the conversion codes stored in the conversion table C differ from the conversion codes stored in the conversion table B;

(xiv) the number of bits "0" successively located in leftmost end bits of each of the conversion codes stored in the conversion table C is equal to the number of bits "0" successively located in leftmost end bits of each of the conversion codes stored in the conversion table B;

(xv) when n-bit source codes are converted according to the conversion tables A and D, each of m-bit conversion codes obtained according to the conversion table A has left most end bits which are identical to leftmost end bits of a corresponding one of m-bit conversion codes obtained according to the conversion table D with respect to succession of bits "0";

(xvi) if rightmost end bits of an m-bit conversion code to be obtained when a first n-bit source code is converted according to the conversion table A are connected to leftmost end bits of an m-bit conversion code to be obtained when an n-bit source code subsequent to a second n-bit source code is converted according to one of the conversion tables A and B, and at least thirteen bits "0" are successively located in the connected right most end bits and leftmost end bits, the first n-bit source code is converted according to the conversion table D;

(xvii) if a lead bit of an m-bit conversion code to be obtained when an n-bit source code subsequent to the second source code is converted according to one of the conversion tables A and B is "1", the second source code is converted according to the conversion table C;

(xviii) when the second source code is converted according to the conversion table C, the an n-bit source code subsequent to a second source code is converted according to the conversion table F;

(xix) if leftmost end bits of an m-bit conversion code to be obtained when an n-bit source code subsequent to a second source code is converted according to the conversion table F are connected to rightmost end bits of an m-bit conversion code to be obtained when an n-bit source code subsequent to the second source code is converted according to one of the conversion tables A and B, and at least thirteen bits "i" are successively located in the connected leftmost end bits and rightmost end bits, the n-bit source code subsequent to the second source code is converted according to the conversion table E.

8. A decoding apparatus according to claim 7, wherein:
when the table identifying means identifies one of the conversion tables C and D as one of the conversion tables which is used to obtain the input m-bit conversion code, exclusive logical processing is performed on the input m-bit conversion code such that bits of the input m-bit conversion code are identical to bits of an m-bit conversion code to be obtained when an n-bit source code, which is one to be converted into the input m-bit source code, according to one of the conversion tables C and D, is converted according to one of the conversion table A and B; and
when the table identifying means identifies one of the conversion tables which is used to obtain the input m-bit conversion code, as one of the conversion tables E and F, shift processing is performed on the input m-bit conversion code such that the bits of the input m-bit conversion code are identical to bits of an m-bit conversion code to be obtained when an n-bit source code, which is to be converted into the input m-bit conversion code according to one of the conversion tables E and F, is converted according to one of the conversion tables A and B.

9. A method for converting an m-bit conversion code into an n-bit source code, comprising:
pre-processing the m-bit conversion code, wherein the step of pre-processing comprises: fetching the m-bit conversion code, generating a pre-processed m-bit conversion code using a plurality of conversion tables and extracting from the pre-processed m-bit conversion code a first data block and a second data block;
a first decoding of the first data block to obtain a first decode output;
a second decoding of the second data block to obtain a second decode output; and
adding the first decode output and the second decode output to obtain the n-bit source code.

10. A method according to claim 9, wherein:
a present m-bit conversion code and a previous m-bit conversion code satisfy the following rules:
(i) at least two bits "0" are successively interposed between a bit "1" and a subsequent bit "1" throughout the present m-bit conversion code;
(ii) at least two bits "0" are successively interposed between a rightmost bit "1" of the previous m-bit conversion code and a leftmost bit "1" of the present m-bit conversion code; and
(iii) the maximum number of bits "0" successively located in the present m-bit conversion code is limited to a predetermined number, and
wherein the pre-processing step includes:
(i) identifying the conversion tables which are used for conversion of the present m-bit conversion code on the basis of the previous m-bit conversion code, the leftmost end bits of the present m-bit conversion code and the rightmost end bits of the present m-bit conversion code;
(ii) arithmetic processing the present m-bit conversion code on the basis of an identification result of the step of identifying the conversion tables, thereby to obtain the pre-processed m-bit conversion code;
(iii) dividing the pre-processed m-bit conversion code into the first data block and the second data block; and
(iv) supplying the first and second data blocks to the first and second decoding steps.

11. A method according to claim 10, wherein a first m-bit conversion code, generated from the n-bit source code by means of a first conversion table, and a second m-bit conversion code, generated from the n-bit source code by means of a second conversion table different from the first conversion table, contain bits that differ from one another in corresponding bit locations.

12. A method according to claim 11, wherein:
when the one of the conversion tables is identified to be used for conversion of the present m-bit conversion code, as a first conversion table, the arithmetic processing includes outputting the present m-bit conversion code as the pre-processed m-bit conversion code; and
when the one of the conversion tables is identified to be used for conversion of the present m-bit conversion code, as a second conversion table, the arithmetic processing includes inverting or shifting predetermined bits of the present m-bit conversion code to provide an intermediate m-bit conversion code and then outputting the intermediate m-bit conversion code as the pre-processed m-bit conversion code.

13. A method according to claim 12, wherein the bits of the intermediate m-bit conversion code are identical to bits of a reference m-bit conversion code into which a reference n-bit source code has been converted according to the first conversion table.

14. A method according to claim 11, wherein the present m-bit conversion code is included in a signal reproduced from an optical disk.

15. A method according to one of the claims 10–14, wherein:
the conversion codes for use in converting a given n-bit source code into a resulting m-bit conversion code, wherein m>n, are stored in conversion tables A, B, C, D, E and F of the conversion tables;
values expressed by n bits are "0" to "N"; each of n-bit source codes which respectively correspond to "0" to "N/2" is a first source code;
the first source code is converted according to the conversion table A;
an n-bit source code is converted according to the conversion table B when the n-bit source code has rightmost end bits including at least six "0" bits successively located;
an n-bit source code is converted according to the conversion table F when a lead bit of the n-bit source code is "1";
an n-bit source code is converted according to the conversion table E when a lead bit of the n-bit source code is "1" and right most end bits of the n-bit source code include at least six "0" bits successively located; and
the conversion codes are stored in the conversion tables A, B, C, D, E, and F such that the conversion codes satisfy the following conditions:
(i) rightmost end two bits of each of the conversion codes stored in the conversion table A are "00";
(ii) rightmost end four bits of each of the conversion codes stored in the conversion table B are "0010";

(iii) rightmost end six bits of each of the conversion codes stored in the conversion table C are "0001";

(iv) rightmost end six bits of each of the conversion codes stored in the conversion table D are "001001";

(v) rightmost end three bits of each of the conversion codes stored in the conversion table E are "001";

(vi) rightmost end two bits of each of the conversion codes stored in the conversion table F are "00";

(vii) at least two bits are successively interposed between bit "1" and bit "1" throughout each of the conversion codes;

(vii) the maximum number of bits "0" successively located in each of the conversion codes stored in the conversion table A is eleven;

(ix) the maximum number of bits "0" successively located in each of the conversion codes stored in the conversion table B is eleven;

(x) the maximum number of bits "0" successively located in each of the conversion codes stored in the conversion tables C, D and E is twelve;

(xi) the maximum number of bits "0" successively located in the conversion codes stored in the conversion table F is nine;

(xii) the conversion codes stored in the conversion table B are not stored in any of the conversion tables A, C, D, E and F;

(xiii) the conversion codes stored in the conversion table C differ from the conversion codes stored in the conversion table B;

(xiv) the number of bits "0" successively located in leftmost end bits of each of the conversion codes stored in the conversion table C is equal to the number of bits "0" successively located in leftmost end bits of each of the conversion codes stored in the conversion table B;

(xv) when n-bit source codes are converted according to the conversion tables A and D, each of m-bit conversion codes obtained according to the conversion table A has left most end bits which are identical to leftmost end bits of a corresponding one of m-bit conversion codes obtained according to the conversion table D with respect to succession of bits "0";

(xvi) if rightmost end bits of an m-bit conversion code to be obtained when a first n-bit source code is converted according to the conversion table A are connected to leftmost end bits of an m-bit conversion code to be obtained when an n-bit source code subsequent to a second n-bit source code is converted according to one of the conversion tables A and B, and at least thirteen bits "0" are successively located in the connected right most end bits and leftmost end bits, the first n-bit source code is converted according to the conversion table D;

(xvii) if a lead bit of an m-bit conversion code to be obtained when an n-bit source code subsequent to the second source code is converted according to one of the conversion tables A and B is "1", the second source code is converted according to the conversion table C;

(xviii) when the second source code is converted according to the conversion table C, an n-bit source code subsequent to a second source code is converted according to the conversion table F;

(xix) if leftmost end bits of an m-bit conversion code to be obtained when an n-bit source code subsequent to a second source code is converted according to the conversion table F are connected to rightmost end bits of an m-bit conversion code to be obtained when an n-bit source code subsequent to the second source code is converted according to one of the conversion tables A and B, and at least thirteen bits "0" are successively located in the connected leftmost end bits and rightmost end bits, the n-bit source code subsequent to the second source code is converted according to the conversion table E.

16. A method according to claim 15, wherein:

when one of the conversion tables is identified to be used to obtain the input m-bit conversion code is one of the conversion tables C and D, exclusive logical processing is performed on the input m-bit conversion code such that bits of the input m-bit conversion code are identical to bits of an m-bit conversion code to be obtained when an n-bit source code, which is to be converted into the input m-bit source code according to one of the conversion tables C and D, is converted according to one of the conversion table A and B; and when one of the conversion tables is identified which is used to obtain the input m-bit conversion code, as one of the conversion tables E and F, shift processing is performed on the input m-bit conversion code such that the bits of the input m-bit conversion code are identical to bits of an m-bit conversion code to be obtained when an n-bit source code, which is to be converted into the input m-bit conversion code according to one of the conversion tables E and F, is converted according to one of the conversion tables A and B.

* * * * *